(12) United States Patent
Yoon et al.

(10) Patent No.: US 10,340,420 B2
(45) Date of Patent: Jul. 2, 2019

(54) SEMICONDUCTOR LIGHT-EMITTING DEVICE HAVING A TRANSPARENT COVER LAYER TAIL PORTION

(71) Applicant: SAMSUNG ELECTRONICS CO., LTD., Suwon-si, Gyeonggi-do (KR)

(72) Inventors: Ju-heon Yoon, Seoul (KR); Jae-in Sim, Yongin-si (KR); Gi-bum Kim, Yongin-si (KR); Ha-yeong Son, Suwon-si (KR); Young-sub Shin, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/876,435

(22) Filed: Jan. 22, 2018

(65) Prior Publication Data
US 2019/0027649 A1    Jan. 24, 2019

(30) Foreign Application Priority Data
Jul. 18, 2017 (KR) .................. 10-2017-0091057

(51) Int. Cl.
*H01L 33/24* (2010.01)
*H01L 33/00* (2010.01)
(Continued)

(52) U.S. Cl.
CPC .......... *H01L 33/24* (2013.01); *H01L 21/0242* (2013.01); *H01L 21/0254* (2013.01); *H01L 21/02433* (2013.01); *H01L 21/02639* (2013.01); *H01L 25/0753* (2013.01); *H01L 33/007* (2013.01); *H01L 33/08* (2013.01); *H01L 33/405* (2013.01); *H01L 33/60* (2013.01); *H01L 51/5218* (2013.01); *H01L 51/5234* (2013.01)

(58) Field of Classification Search
CPC ....... H01L 33/24; H01L 33/007; H01L 33/08; H01L 33/405; H01L 33/60; H01L 25/0753; H01L 51/5218; H01L 51/5234; H01L 21/0242; H01L 21/02433; H01L 21/0254; H01L 21/02639
See application file for complete search history.

(56) References Cited

U.S. PATENT DOCUMENTS 6,372,608 B1    4/2002   Shimoda et al.
6,573,537 B1    6/2003   Steigerwald et al.
(Continued)

FOREIGN PATENT DOCUMENTS

KR         10-1725783 B1       4/2015

*Primary Examiner* — Ida M Soward
(74) *Attorney, Agent, or Firm* — Lee & Morse, P.C.

(57) ABSTRACT

A semiconductor light-emitting device includes a light-emitting structure, a reflective electrode layer, and a transparent cover layer. The light-emitting structure includes a first semiconductor layer, an active layer, and a second semiconductor layer. The reflective electrode layer covers an upper surface of the second semiconductor layer. The transparent cover layer covers an upper surface of the second semiconductor layer on the reflective electrode layer. The transparent cover layer includes a tail portion including a first portion and a second portion. The first portion covers an edge of the reflective electrode layer and a convex upper surface. The second portion is thinner than and extends from the first portion.

20 Claims, 18 Drawing Sheets

(51) Int. Cl.
*H01L 33/08* (2010.01)
*H01L 33/60* (2010.01)
*H01L 25/07* (2006.01)
*H01L 51/52* (2006.01)
*H01L 21/02* (2006.01)
*H01L 33/40* (2010.01)
*H01L 25/075* (2006.01)

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,291,865 B2 * | 11/2007 | Kojima | H01L 33/405 257/78 |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,786,493 B2 | 8/2010 | Watanabe et al. | |
| 7,790,482 B2 | 9/2010 | Han et al. | |
| 7,884,543 B2 * | 2/2011 | Doi | H01L 33/62 257/98 |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,990,058 B2 * | 8/2011 | Cok | H01L 27/322 313/503 |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,963,178 B2 * | 2/2015 | Lee | H01L 27/153 257/98 |
| 9,117,973 B2 | 8/2015 | Deguchi | |
| 9,136,438 B2 | 9/2015 | Tanaka | |
| 9,231,163 B2 * | 1/2016 | Miyachi | H01L 33/06 |
| 9,530,941 B2 | 12/2016 | Jeon et al. | |
| 9,653,645 B2 * | 5/2017 | Jang | H01L 33/025 |
| 9,946,107 B2 * | 4/2018 | Sato | G02F 1/1334 |
| 2004/0227864 A1 * | 11/2004 | Kim | G02F 1/13458 349/43 |
| 2014/0138731 A1 * | 5/2014 | Nakamura | H01L 33/02 257/98 |
| 2016/0284941 A1 * | 9/2016 | Seo | H01L 33/46 |
| 2017/0018218 A1 * | 1/2017 | Tamaki | G09G 3/3607 |
| 2017/0108173 A1 * | 4/2017 | Kim | F21K 9/232 |
| 2018/0175247 A1 * | 6/2018 | Yoon | H01L 33/405 |
| 2018/0198045 A1 * | 7/2018 | Perzlmaier | H01L 33/38 |
| 2018/0269429 A1 * | 9/2018 | Kudo | H01L 51/5284 |

* cited by examiner

B-B'

B-B'

B-B'

B-B'

B-B'

B-B'

B-B'

B-B'

B-B'

B-B'

SEMICONDUCTOR LIGHT-EMITTING DEVICE HAVING A TRANSPARENT COVER LAYER TAIL PORTION

CROSS-REFERENCE TO RELATED APPLICATION

Korean Patent Application No. 10-2017-0091057, filed on Jul. 18, 2017, and entitled, "Semiconductor Light-Emitting Device," is incorporated by reference herein in its entirety.

BACKGROUND

1. Field

One or more embodiments described herein relate to a semiconductor light-emitting device.

2. Description of the Related Art

A light-emitting diode (LED) is a kind of a semiconductor device used in displays, lighting devices, and other applications. As the lighting LED market expands and its application range extends to high current and high power, reliability and light extraction efficiency are being sought after. For example, one area that has gained attention relates to the electrical connection between an external structure (e.g., module or package) and a semiconductor layer of the LED.

SUMMARY

In accordance with one or more embodiments, a semiconductor light-emitting device includes a light-emitting structure including a first semiconductor layer, an active layer, and a second semiconductor layer; a reflective electrode layer covering an upper surface of the second semiconductor layer; and a transparent cover layer covering an upper surface of the second semiconductor layer on the reflective electrode layer, wherein the transparent cover layer includes a tail portion including a first portion and a second portion, the first portion covering an edge of the reflective electrode layer and a convex upper surface and the second portion being thinner than and extending from the first portion.

In accordance with one or more other embodiments, a semiconductor light-emitting device includes a light-emitting structure including a first semiconductor layer, an active layer, a second semiconductor layer, and a mesa structure defined by a plurality of trenches exposing a lower surface portion of the first semiconductor layer; a reflective electrode layer covering an upper surface of the mesa structure and spaced apart from an edge of the upper surface of the mesa structure; and a transparent cover layer covering at least a portion of the reflective electrode layer and a portion of an upper surface of the second semiconductor layer, on the reflective electrode layer, wherein the transparent cover layer is thicker than adjacent portions around the edge of the reflective electrode layer, and wherein the edge of the transparent cover layer is spaced apart from the edge of the upper surface of the mesa structure and positioned at an inner portion of the upper surface of the mesa structure.

In accordance with one or more other embodiments, a semiconductor light-emitting device includes a light-emitting structure including a first semiconductor layer, an active layer, and a second semiconductor layer and having a mesa structure defined by a plurality of trenches exposing a lower surface portion of the first semiconductor layer; a reflective electrode layer covering an upper surface of the mesa structure and spaced apart from an edge of the upper surface of the mesa structure; a transparent cover layer covering at least a portion of the reflective electrode layer and a portion of an upper surface of the second semiconductor layer and spaced apart from an edge of an upper surface of the mesa structure, on the reflective electrode layer; an insulating structure covering an upper surface of the first semiconductor layer and an upper surface of the second semiconductor layer around the transparent cover layer; a first interconnection conductive layer electrically connected to the first semiconductor layer through the insulating structure; and a second interconnection conductive layer electrically connected to the reflective electrode layer through the insulating structure, wherein the transparent cover layer includes a first portion including an upper surface that upwardly protrudes at a higher level than adjacent upper surfaces around an edge of the reflective electrode layer and a tail portion extending from the first portion and comprising a second portion having a concave upper surface.

BRIEF DESCRIPTION OF THE DRAWINGS

Features will become apparent to those of skill in the art by describing in detail exemplary embodiments with reference to the attached drawings in which:

FIGS. 2B to 10B are cross-sectional views taken along lines B-' of FIGS. 2A to 10A, respectively;

DETAILED DESCRIPTION

Figure 1A:
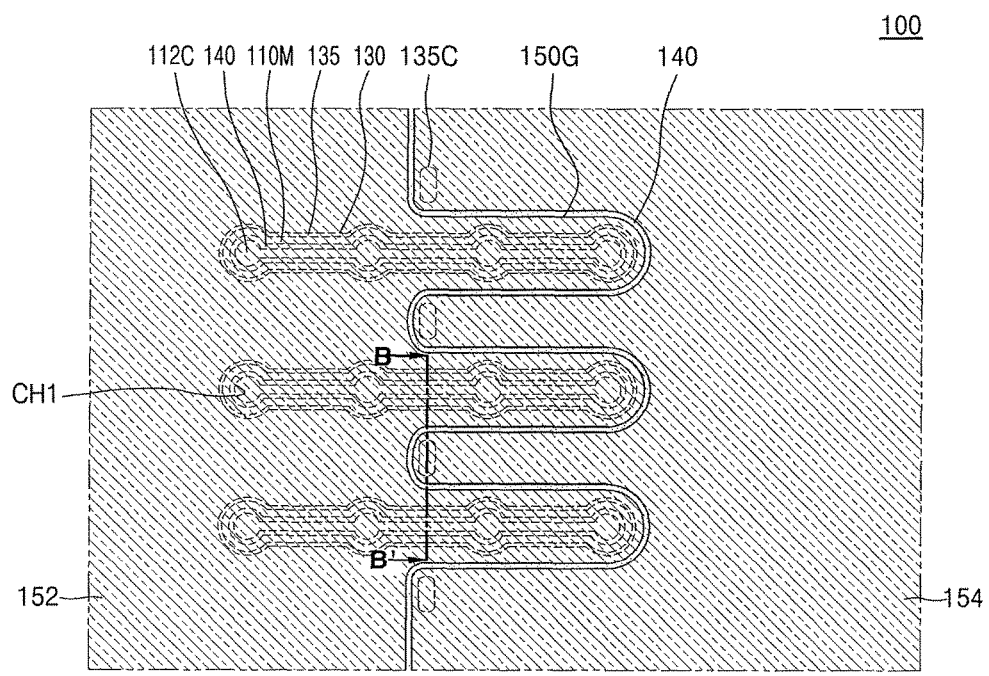
FIG. 1A illustrates a planar layout embodiment of a semiconductor light-emitting device.
Figure 1B:
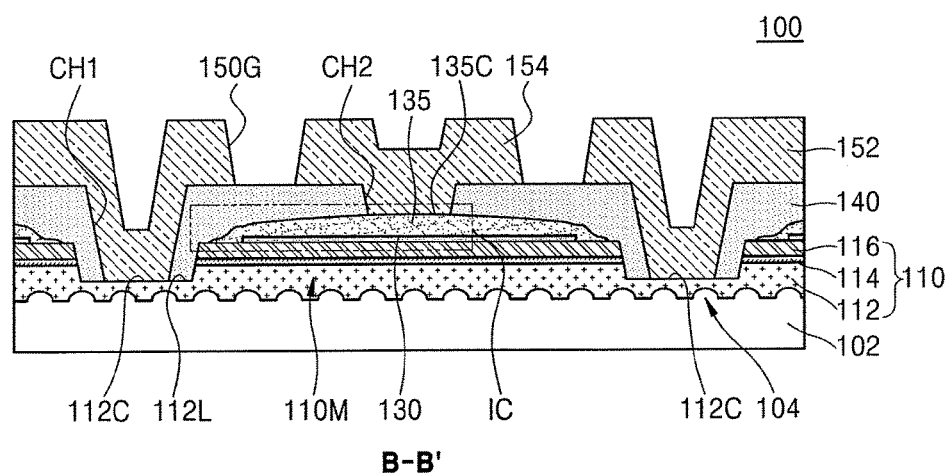
FIG. 1B illustrates a cross-sectional view taken along line B-B' of FIG. 1A.
Figure 1C:
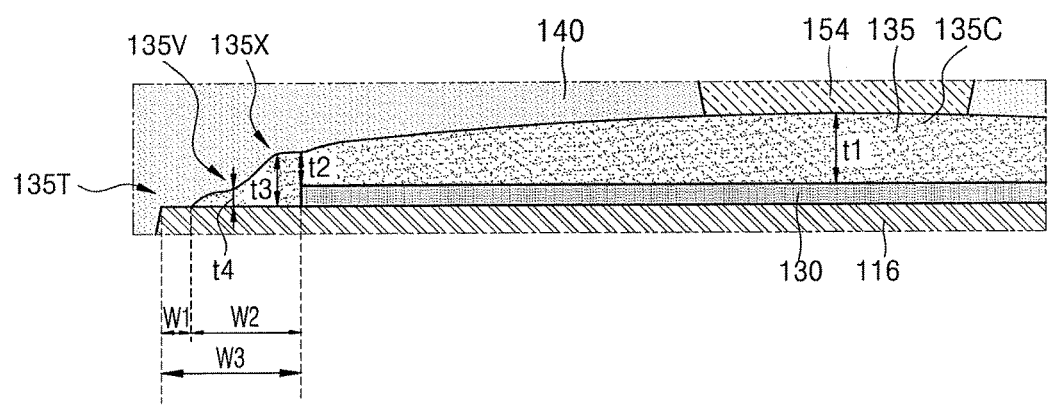
FIG. 1C illustrates an enlarged view of an IC region of FIG. 1B.

FIG. 1A illustrates a planar layout embodiment of a semiconductor light-emitting device 100, FIG. 1B illustrates a cross-sectional view taken along line B-B' of FIG. 1A, and FIG. 1C illustrates an enlarged view of an IC region of FIG. 1B.

Referring to FIGS. 1A and 1B, the semiconductor light-emitting device 100 includes a light-emitting structure 110 formed on a substrate 102. The light-emitting structure 110 includes a first semiconductor layer 112, an active layer 114, and a second semiconductor layer 116. The light-emitting structure 110 includes a mesa structure 110M. The mesa structure 110M is defined by a plurality of trenches 118 formed, for example, by removing portions of each of the second semiconductor layer 116, the active layer 114, and the first semiconductor layer 112. A lower surface portion 112L of the first semiconductor layer 112 may be exposed at a bottom surface of the plurality of trenches 118.

A surface of the substrate 102, facing the first semiconductor layer 112, has an uneven pattern 104. The uneven pattern 104 is formed on the surface of the substrate 102. Thus, the crystallinity of semiconductor layers formed on the substrate 102 may be improved, defect density may be reduced to improve internal quantum efficiency, and extraction efficiency (by the diffuse reflection of light on the surface of the substrate 102) may be increased to improve the light extraction efficiency of the semiconductor light-emitting device 100.

The substrate 102 may include a transparent substrate. For example, the substrate 102 may include sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$). For example, each of the first semiconductor layer 112, the active layer 114, and the second semiconductor layer 116 may include a gallium nitride-based compound semiconductor represented by $In_xAl_yGa_{(1-x-y)}N$ ($0 \le x \le 1$, $0 \le y \le 1$, $0 \le x+y \le 1$).

In some embodiments, the first semiconductor layer 112 may include an n-type GaN layer supplying electrons to the active layer 114 according to power supply. The n-type GaN layer may include an n-type impurity of one or more Group IV elements. The n-type impurity may include, for example, Si, Ge, and/or Sn.

In some embodiments, the second semiconductor layer 116 may include a p-type GaN layer supplying holes to the active layer 114 according to power supply. The p-type GaN layer may include a p-type impurity of one or more Group II elements. In some embodiments, the p-type impurity may include, for example, Mg, Zn, and/or Be.

The active layer 114 emits light having a predetermined energy based on a recombination of electrons and holes. The active layer 114 may have a structure in which a quantum well and a quantum barrier are stacked alternately at least once. The quantum well may have a single quantum well structure or a multi-quantum well structure. In some embodiments, the active layer 114 may include u-AlGaN. In some embodiments, the active layer 114 may include a multi-quantum well structure of GaN/AlGaN, InAlGaN/InAlGaN, or InGaN/AlGaN. In order to improve luminous efficiency of the active layer 114, the depth of the quantum well, the number of layers of a pair of a quantum well and a quantum barrier, the thickness, and/or other features may be changed in the active layer 114.

In some embodiments, the semiconductor light-emitting device 100 may further include a nitride semiconductor thin film between the substrate 102 and the light-emitting structure 110. The nitride semiconductor thin film may serve as a buffer layer to mitigate lattice mismatch between the substrate 102 and the first semiconductor layer 112. The nitride semiconductor thin film may include a gallium nitride compound semiconductor represented by $In_xAl_yGa_{(1-x-y)}N$ ($0 \le x \le 1$, $0 \le y \le 1$, $0 \le x+y \le 1$). In some embodiments, the nitride semiconductor thin film may include GaN or AlN. In some embodiments, the nitride semiconductor thin film may include superlattice layers of AlGaN/AlN.

The semiconductor light-emitting device 100 includes a reflective electrode layer 130 covering an upper surface of the second semiconductor layer 116. The reflective electrode layer 130 may reflect light emitted from the active layer 114 of the mesa structure 110M. The reflective electrode layer 130 may include a metal or alloy having a high reflectivity in the wavelength range of light emitted from the active layer 114. In some embodiments, the reflective electrode layer 130 may include Ag, Al, a combination thereof, or an alloy thereof. The Al alloy may include Al and a metal having a work function larger than Al. In some embodiments, the reflective electrode layer 130 may include at least one metal of Al, Ni, Au, Ag, Ti, Cr, Pd, Cu, Pt, Sn, W, Rh, Ir, Ru, Mg, and Zn, or an alloy containing at least one metal. In some embodiments, the reflective electrode layer 130 may include a metal layer having both ohmic and light reflective properties.

In some embodiments, the reflective electrode layer 130 may include multiple films including a first metal film having an ohmic property, and a second metal film having a light reflective property. For example, the first metal film may include Pt, Pd, Ni, Au, Ti, or an alloy or a multiple metal film including at least one of Pt, Pd, Ni, Au, and Ti. The second metal film may include, for example, Ag, Al, or an alloy or a multiple metal film including at least one of Ag and Al.

In some embodiments, the reflective electrode layer 130 may include multiple films including a first metal film having a light reflective property and a second metal film having a barrier property. The first metal film may include, for example, Ag, Al, or an alloy or a multiple metal film including at least one of Ag and Al. The second metal film may include, for example, Ni, Ti, or an alloy or a multiple metal layer including at least one of Ni and Ti. In some embodiments, the reflective electrode layer 130 may further include a conductive film that contacts the second semiconductor layer 116 and have an adhesive property. The conductive film having an adhesive property may be a metal film (e.g., Ni) or a transparent conductive film (e.g., ITO). In some embodiments, for example, the reflective electrode layer 130 may include, but is not limited to, a stacked structure of Ag/Ni/Ti or Ni/Ag/Pt/Ti/Pt.

The reflective electrode layer 130 may contact the second semiconductor layer 116. In some embodiments, another semiconductor layer may also be between the second semiconductor layer 116 and the reflective electrode layer 130.

The semiconductor light-emitting device 100 includes a transparent cover layer 135 covering the reflective electrode layer 130. The transparent cover layer 135 may cover an upper surface and a side surface of the reflective electrode layer 130. The transparent cover layer 135 may cover the remaining surface of the reflective electrode layer 130 that is not in contact with the second semiconductor layer 116. The transparent cover layer 135 may cover the reflective electrode layer 130 and one or more portions of an upper surface of the second semiconductor layer 116 adjacent to the reflective electrode layer 130.

The reflective electrode layer 130 may be surrounded by the second semiconductor layer 116 and the transparent cover layer 135. Therefore, the transparent cover layer 135 may prevent the reflective electrode layer 130 from being peeled off the upper surface of the second semiconductor layer 116.

The transparent cover layer 135 may not cover some portions of the upper surface of the mesa structure 110M, that is, some portions of the upper surface of the second semiconductor layer 116. For example, the transparent cover layer 135 may not cover a portion of the upper portion of the second semiconductor layer 116, which is adjacent to an edge of the second semiconductor layer 116. Thus, an edge of the transparent cover layer 135 may be spaced apart from the edge of the upper surface of the second semiconductor layer 116.

In some embodiments, the transparent cover layer 135 may entirely cover a portion of the upper surface of the second semiconductor layer 116. In this case, the edge of the transparent cover layer 135 may be positioned along the edge of the upper surface of the second semiconductor layer 116.

The transparent cover layer 135 may include, for example, a conductive oxide. The transparent cover layer 135 may include at least one of $TiO_x$, $RuO_x$, $IrO_x$, MgO, $SnO_2$, MgO, ZnO, $In_2O_3$, $TiTaO_2$, $TiNbO_2$, indium tin oxide (ITO), indium zinc oxide (IZO), indium zinc tin oxide (IZTO), antimony-doped tin oxide (ATO), Al-doped zinc oxide (AZO), indium aluminum zinc oxide (IAZO), gallium-doped zinc oxide (GZO), indium gallium oxide (IGO), indium gallium zinc oxide (IGZO), indium gallium tin oxide (IGTO), aluminum tin oxide (ATO), indium tungsten oxide (IWO), copper indium oxide (CIO), magnesium indium oxide (MIO), and fluorine-doped tin oxide (FTO).

The semiconductor light-emitting device 100 may include an insulating structure 140 covering the upper surface of the second semiconductor layer 116 around the transparent cover layer 135. The insulating structure 140 may cover a portion of the transparent cover layer 135 and at least a portion of the surface of the second semiconductor layer 116, which is not covered by the transparent cover layer 135. The insulating structure 140 may include, but is not limited to, $SiO_2$, $Si_3N_4$, $MgF_2$, or a combination thereof.

The insulating structure 140 may not cover at least a portion of the first semiconductor layer 112 and at least a portion of the transparent cover layer 135. The insulating structure 140 defines a first contact hole CH1 exposing at least a portion of the first semiconductor layer 112 and a second contact hole CH2 exposing at least a portion of the transparent cover layer 135. A first contact region 112C of the first semiconductor layer 112 may be exposed by the first contact hole CH1, and a second contact region 135C of the transparent cover layer 135 may be exposed by the second contact hole CH2.

The insulating structure 140 may also cover a side surface of the mesa structure 110M. The insulating structure 140 may also cover a portion of the upper surface of the first semiconductor layer 112.

The semiconductor light-emitting device 100 includes a first interconnection conductive layer 152 in contact with the first contact region 112C of the first semiconductor layer 112 and a second interconnection conductive layer 154 in contact with the second contact region 135C of the transparent cover layer 135. The first interconnection conductive layer 152 and the second interconnection conductive layer 154 may respectively contact the first contact region 112C and the second contact region 135C through the insulating structure 140. The first contact region 112C is covered by the first interconnection conductive layer 152. The second contact region 135C is covered by the second interconnection conductive layer 154.

The first interconnection conductive layer 152 and the second interconnection conductive layer 154 are spaced apart from each other with a separation space 150G therebetween. The first interconnection conductive layer 152 and the second interconnection conductive layer 154 may be electrically connected to respectively supply power to the first semiconductor layer 112 and the second semiconductor layer 116. In some embodiments, the first interconnection conductive layer 152 may be an n-type electrode or may be a conductive layer which electrically connects the n-type electrode to the first semiconductor layer 112. The second interconnection conductive layer 154 may be a p-type electrode or may a conductive layer which electrically connects the p-type electrode and the second semiconductor layer 116.

The first interconnection conductive layer 152 may cover the first contact region 112C of the first semiconductor layer 112, the lower surface portion 112L, and a side wall and an upper surface of the mesa structure 110M. In addition, the first interconnection conductive layer 152 over the upper surface of the mesa structure 110M may cover a region, which is not covered by the transparent cover layer 135, of the upper surface of the second semiconductor layer 116, and the upper surface of the transparent cover layer 135.

The first interconnection conductive layer 152 may include a first metal reflective film in contact with the first contact region 112C of the first semiconductor layer 112. The second interconnection conductive layer 154 may include a second metal reflective film in contact with the second contact region 135C of the transparent cover layer 135. Each of the first metal reflective film and the second metal reflective film may include, for example, Al, Ag, or a combination thereof.

In some embodiments, each of the first interconnection conductive layer 152 and the second interconnection conductive layer 154 may include multiple metal layers. In some embodiments, each of the first interconnection conductive layer 152 and the second interconnection conductive layer 154 may have a structure in which a metal reflective film, a metal barrier film, and a metal wiring film are stacked in order. The metal reflective film may include, for example, Al, Ag, or a combination thereof. The metal barrier film may include, for example, Cr, Ti, and a combination thereof. The metal wiring film may include, for example, Cu, Cr, or a combination thereof. In some embodiments, each of the first interconnection conductive layer 152 and the second interconnection conductive layer 154 may have, for example, a stacked structure of Al/Cr/Ti/Cu/Cr, a stacked structure of Ag/Cr/Ti/Cu/Cr, a stacked structure of Al/Cr/Ti/Cr/Ti/Cu/Cr, or a stacked structure of Ag/Cr/Ti/Cr/Ti/Cu/Cr.

Referring to FIG. 1C, the transparent cover layer 135 may have a first thickness t1 around a center of a horizontal direction or at a portion of the second contact region 135C, a second thickness t2 on an edge of the reflective electrode layer 130 or on a portion adjacent to an inner portion of the edge of the reflective electrode layer 130, a third thickness t3 on the edge of the reflective electrode layer 130 or on a portion adjacent to an outer portion of the edge of the reflective electrode layer 130, and a fourth thickness t4 on the second semiconductor layer 116 spaced apart from the edge of the reflective electrode layer 130. The thickness may correspond, for example, to a thickness measured in a direction perpendicular to the upper surface of the second semiconductor layer 116.

The first thickness t1 may be the largest thickness of the transparent cover layer 135, e.g., the first thickness t1 may be larger than the second to fourth thicknesses t2, t3, and t4. The second thickness t2 may be less than the third thickness t3. The fourth thickness t4 may be less than the second thickness t2 and the third thickness t3. Therefore, the thickness of the transparent cover layer 135 may decrease from the center toward the edge of the transparent cover layer 135, increase around the edge of the reflective electrode layer 130, and then decrease again toward the edge of the transparent cover layer 135.

In one embodiment, the first thickness t1 of the transparent cover layer 135 around the center is the largest thickness. This thickness may then decrease from the center to the edge to have the second thickness t2 on the edge of the reflective electrode layer 130 or on the portion adjacent to the inner portion of the edge of the reflective electrode layer 130, then increase toward the edge to have the thickness t3 on the edge of the reflective electrode layer 130 or on the portion adjacent to the outer portion of the edge of the reflective electrode layer 130, and then decreases toward the edge again. The portion having the second thickness t2 of the transparent cover layer 135 may be inwardly positioned toward the center of the transparent cover layer 135 than the portion having the third thickness t3.

In some embodiments, the transparent cover layer 135 may have a region having the first thickness t1, which is relatively uniform, in a certain region around the center.

The transparent cover layer 135 may have a tail portion 135T that is adjacent to the edge of the transparent cover layer 135, covers the edge of the reflective electrode layer 130, and extends toward the edge of the transparent cover layer 135. The tail portion 135T may include a first portion 135X, which is thicker than adjacent portions around the edge of the reflective electrode layer 130, and a second portion 135V, which extends from the first portion 135X to the edge of the transparent cover layer 135 and thinner than the first portion 135X. The tail portion 135T of the transparent cover layer 135 may entirely cover the edge of the reflective electrode layer 130. For example, when the edge of the reflective electrode layer 130 has a relatively vertical side surface, the side surface of the edge of the reflective electrode layer 130 may be entirely covered by the tail portion 135T of the transparent cover layer 135.

In some embodiments, the transparent cover layer 135 may have a convex upper surface on the edge of the reflective electrode layer 130 or on a portion adjacent to the outer portion of the edge of the reflective electrode layer 130, e.g., a portion having the third thickness t3. In some embodiments, the transparent cover layer 135 may include the first portion 135X having a convex upper surface, e.g., an upper surface of a portion having the third thickness t3 may protrude upward and may have a higher level than the adjacent upper surface with respect to the upper surface of the second semiconductor layer 116. In some embodiments, a portion adjacent to the edge of the transparent cover layer 135, e.g., a portion having the fourth thickness t4 may include the second portion 135V having a concave upper surface. In the transparent cover layer 135, a portion having the second thickness t2 may be a portion on a portion around the edge of the reflective electrode layer 130 positioned inwardly toward the center of the transparent cover layer 135, rather than a portion having the third thickness t3, that is the first portion 135X.

The transparent cover layer 135 may include the first portion 135X having the convex upper surface and the second portion 135V having the concave upper surface at a portion extending from the periphery of the edge of the reflective electrode layer 130 toward the edge of the transparent cover layer 135. The edge of the reflective electrode layer 130 may be protected by the first portion 135X and the second portion 135V constituting the tail portion 135T of the transparent cover layer 135, thereby preventing the reflective electrode layer 130 from being peeled off the upper surface of the second semiconductor layer 116.

The edge of the upper surface of the second semiconductor layer 116 and the edge of the transparent cover layer 135 may be spaced apart from each other by a first distance W1. The edge of the transparent cover layer 135 and the edge of the reflective electrode layer 130 may be spaced apart from each other by a second distance W2. In some embodiments, the first distance W1 may be equal to or less than 1 μm. In some embodiments, the second distance W2 may be equal to or less than 1 μm. The edge of the upper surface of the second semiconductor layer 116 and the edge of the reflective electrode layer 130 may be spaced apart from each other by a third distance W3, which is the sum of the first distance W1 and the second distance W2.

In some embodiments, the third distance W3 may be equal to or less than 2 μm. Thus, the distance between the upper surface of the mesa structure 110M (e.g., the edge of the upper surface of the second semiconductor layer 116 and the edge of the transparent cover layer 135) which is the first distance W1 may be less than the distance between the edge of the upper surface of the second semiconductor layer 116 and the edge of the reflective electrode layer 130, which is the third distance W3. The distances W1, W2, and W3 may be different from the values given above in other embodiments.

In accordance with the present embodiment, the semiconductor light-emitting device 100 may prevent the reflective electrode layer 130 from peeling off as a result of the transparent cover layer 135 covering the reflective electrode layer 130. Thus, reliability of an electrode for electrically connecting an external structure to the second semiconductor layer 116 may be improved.

Also, the distance between the edge of the reflective electrode layer 130 and the edge of the upper surface of the second semiconductor layer 116 (e.g., the edge of the upper surface of the mesa structure 110M) may be relatively small, so that a reflective area due to the reflective electrode layer 130 increases and light extraction efficiency of the semiconductor light-emitting device 100 may be improved.

Figure 2A:
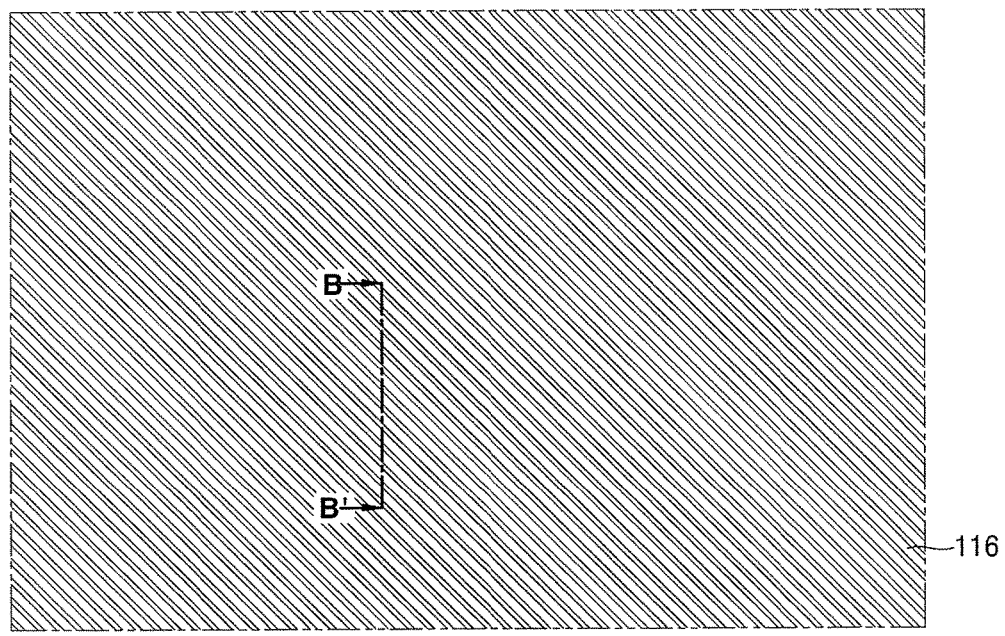
FIGS. 2A/2B to 10A/10B illustrates various stages of an embodiment of a method for manufacturing a semiconductor light-emitting device, where

FIGS. 2A/2B to 10A/10B illustrate various stages corresponding to an embodiment of a method for manufacturing a semiconductor light-emitting device. FIGS. 2B to 10B are cross-sectional views respectively taken along lines B-B' of FIGS. 2A to 10A.

Figure 2B:
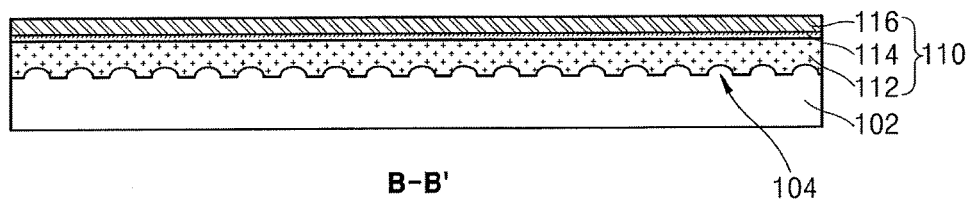

Referring to FIGS. 2A and 2B, the method includes forming the light-emitting structure 110 on the substrate 102. The light-emitting structure 110 has the first semiconductor layer 112, the active layer 114, and the second semiconductor layer 116 with the uneven pattern 104. The first semiconductor layer 112 may be formed, for example, on a surface of the substrate 102 having the uneven pattern 104.

Metal organic chemical vapor deposition (MOCVD), hydride vapor phase epitaxy (HVPE), or molecular beam epitaxy (MBE) may be used to sequentially form the first semiconductor layer 112, the active layer 114, and the second semiconductor layer 116 of the light-emitting structure 110. In some embodiments, the first semiconductor layer 112 may be an n-type semiconductor layer. In some embodiments, the second semiconductor layer 116 may be a p-type semiconductor layer.

Figure 3A:
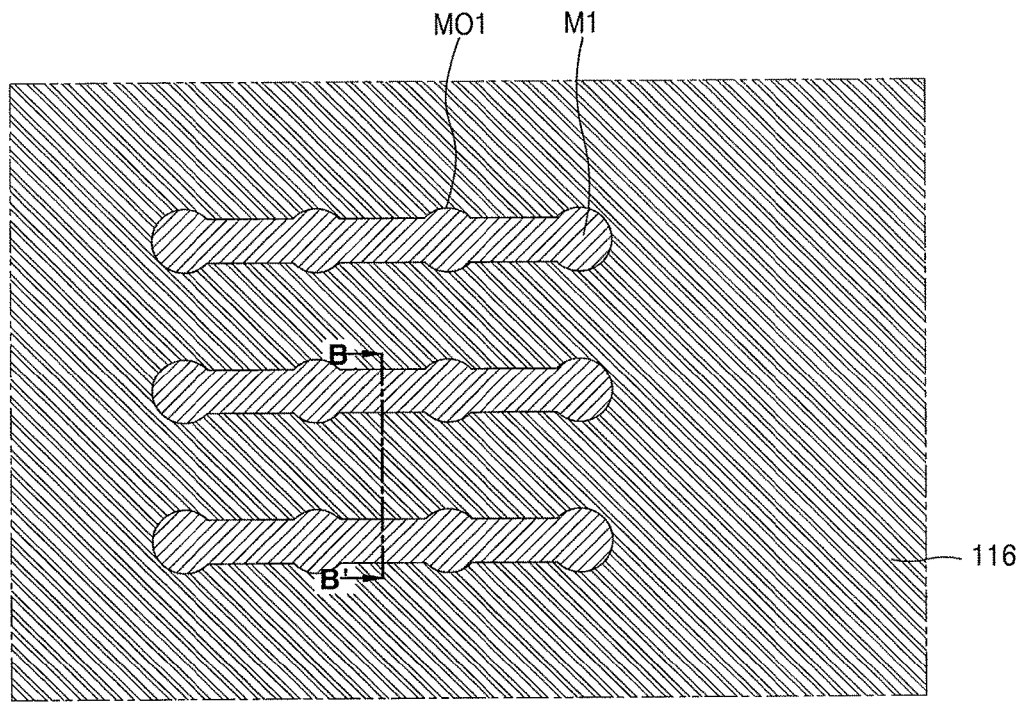
Figure 3B:
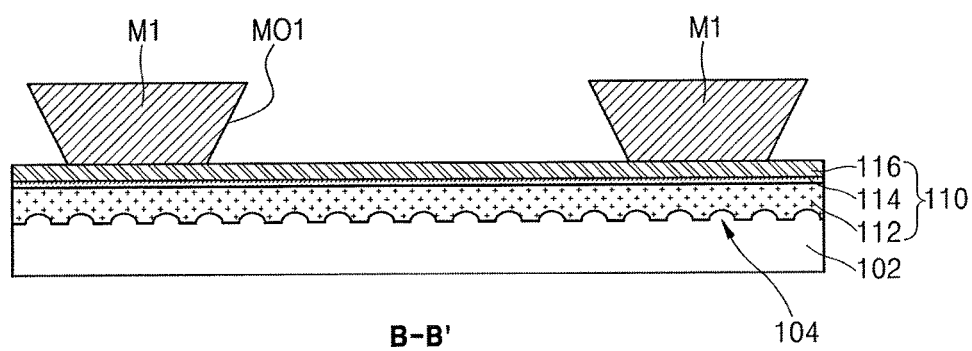

Referring to FIGS. 3A and 3B, a first mask pattern M1 having a first opening MO1 is formed on the light-emitting structure 110, that is, the second semiconductor layer 116. The first mask pattern M1 may be formed, for example, using a negative photoresist. The first mask pattern M1 may be tapered, e.g., the width of the first mask pattern M1 may narrow from an upper surface to a lower surface of first mask pattern M1. The first mask pattern M1 may have a cross-section of, for example, an inverted trapezoid with a wider upper surface than the lower surface.

Figure 4A:
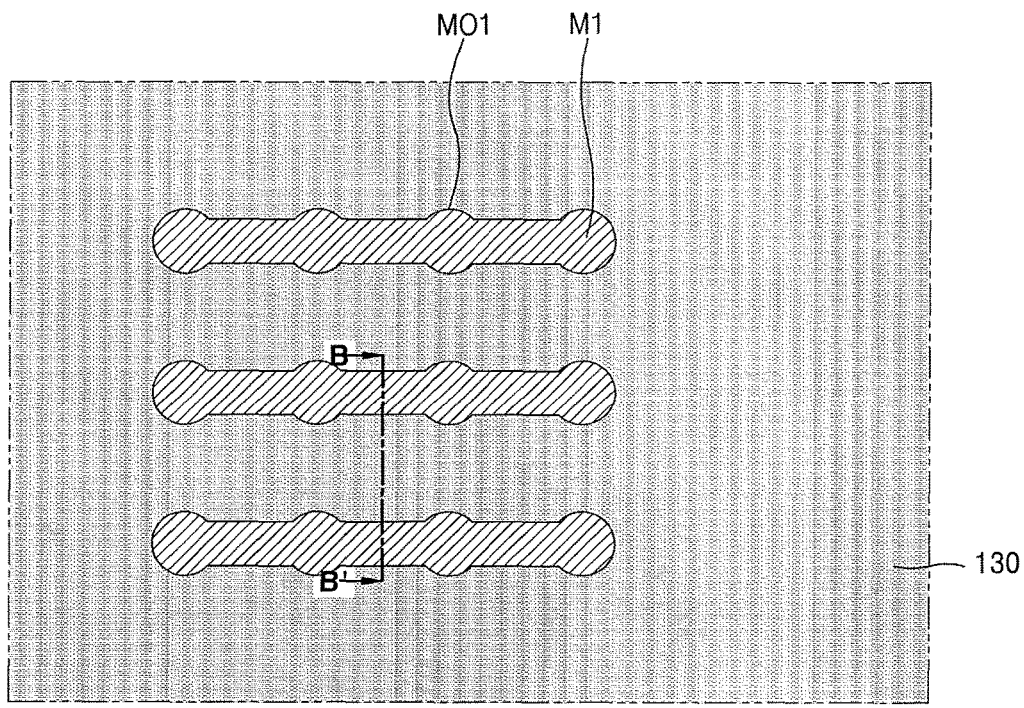
Figure 4B:
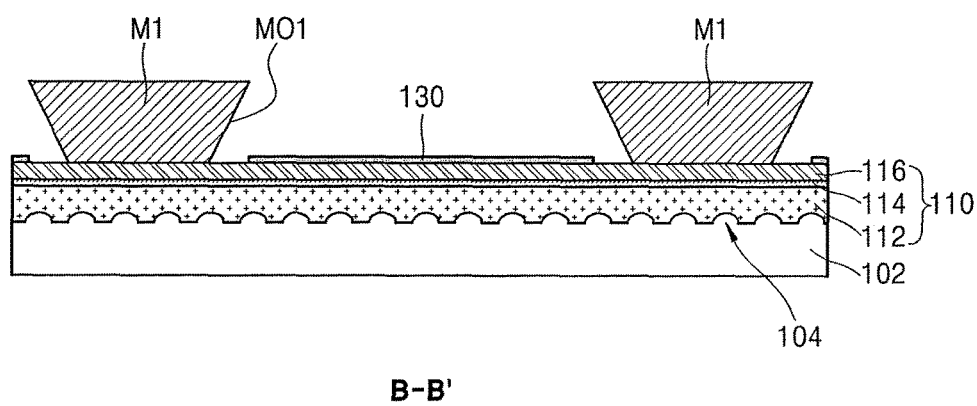

Referring to FIGS. 4A and 4B, the reflective electrode layer 130 is formed on the light-emitting structure 110 on which the first mask pattern M1 is formed. The reflective electrode layer 130 may cover a portion of the upper surface of the second semiconductor layer 116 that is not covered by the first mask pattern M1 and exposed. For example, the reflective electrode layer 130 may be formed by a directed vapor deposition (DVD) process using electron beam evaporation. In this case, the reflective electrode layer 130 may be formed on a portion of the upper surface of the second semiconductor layer 116, corresponding to the first opening MO1 of a portion of the upper surface of the first mask pattern M1. For example, the reflective electrode layer 130 may be formed on a portion of the upper surface of the second semiconductor layer 116 that does not overlap the upper surface of the first mask pattern M1 in a vertical direction. Thus, the reflective electrode layer 130 may be spaced apart from a lower portion of the first mask pattern M1.

In a formation process of the reflective electrode layer 130, a layer including the same material as the reflective electrode layer 130 may be formed on the upper surface of the first mask pattern M1.

Figure 5A:
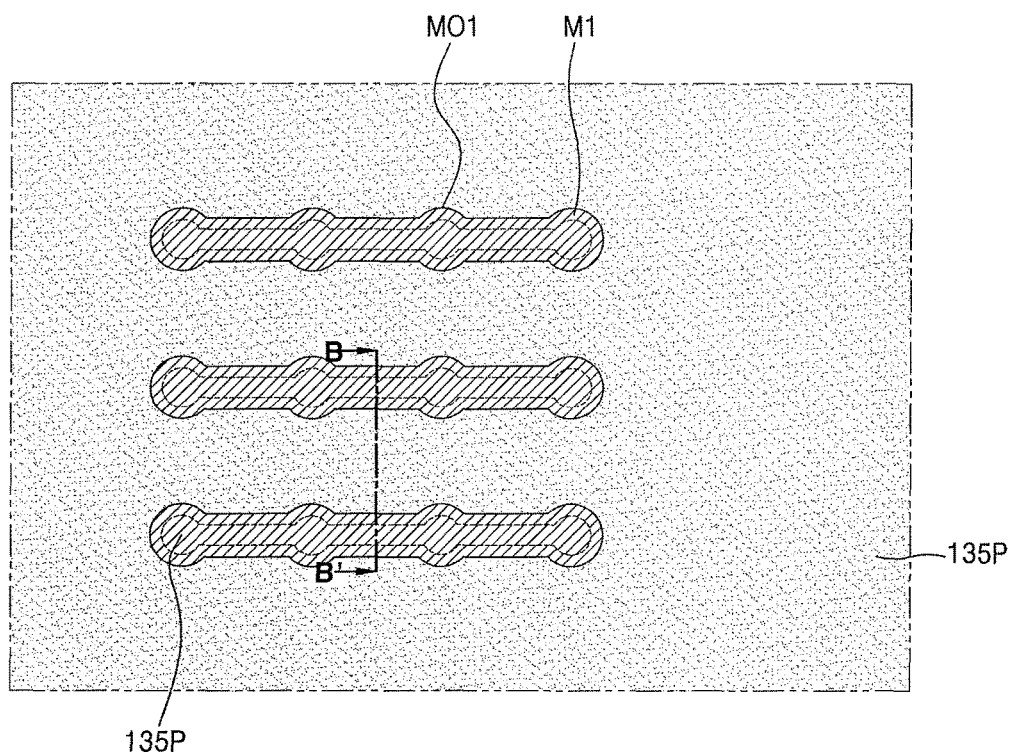
Figure 5B:
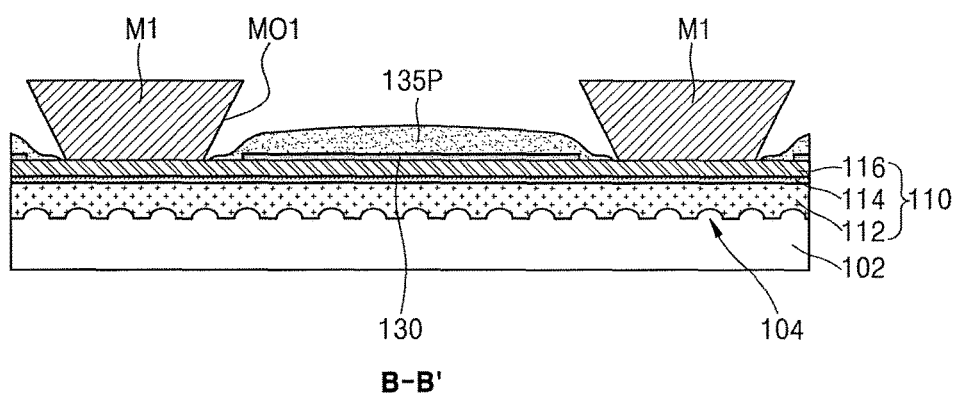

Referring to FIGS. 5A and 5B, a transparent material layer 135P may be formed on the light-emitting structure 110 on which the reflective electrode layer 130 is formed. The transparent material layer 135P may be formed on the reflective electrode layer 130 and on a portion where the upper surface of the first mask pattern M1 overlaps the upper surface of the second semiconductor layer 116. For example, the transparent material layer 135P may be formed by a sputtering deposition method. In some embodiments, the transparent material layer 135P may be formed by a tilted sputtering deposition method. In this case, the transparent material layer 135P may also be formed on at least a portion of the portion where the upper surface of the first mask pattern M1 overlaps the upper surface of the second semiconductor layer 116.

A change in thickness and a shape of the upper surface of the transparent material layer 135P may vary depending, for example, on a position of the transparent material layer 135P, which may be similar to the transparent cover layer 135 (e.g., see FIG. 1C) described with reference to FIG. 1C. As described below, the transparent cover layer 135 is a result of removing a portion of the upper portion and a portion of the edge, of the transparent material layer 135P. Thus, the transparent material layer 135P may have a relatively large thickness around the edge of the reflective electrode layer 130 and a portion with a convex upper surface, and a portion adjacent to the edge of the transparent material layer 135P may have relatively less thickness and a portion with a concave upper surface.

A source for forming the transparent material layer 135P is transferred onto the second semiconductor layer 116 through the first opening MO1. The space of the upper surface of the second semiconductor layer 116 may decrease as a portion of the first mask pattern M1 gets closer to the lower surface of the first mask pattern M1. As a result, the source may be transferred with a relatively lesser extent to the upper surface of the second semiconductor layer 116, as a portion of the first mask pattern M1 gets closer to the lower surface of the first mask pattern M1. Accordingly, as described above, the transparent material layer 135P may have a relatively large thickness around the edge of the reflective electrode layer 130 and may have a portion with a convex upper surface. The transparent material layer 135P may have a relatively less thickness on a portion adjacent to the edge and may have a portion with a concave upper surface.

In some embodiments, as the source transferred onto the second semiconductor layer 116 is less transferred to a portion adjacent to the lower surface of the first mask pattern M1, a relatively large amount of the source is supplied to a portion around the edge of the reflective electrode layer 130. An upper surface of the portion with the convex upper surface may protrude and have a higher level than other portions.

In the formation process of the transparent material layer 135P, a layer including the same material as the transparent material layer 135P may be formed on the upper surface of the first mask pattern M1.

Figure 6A:
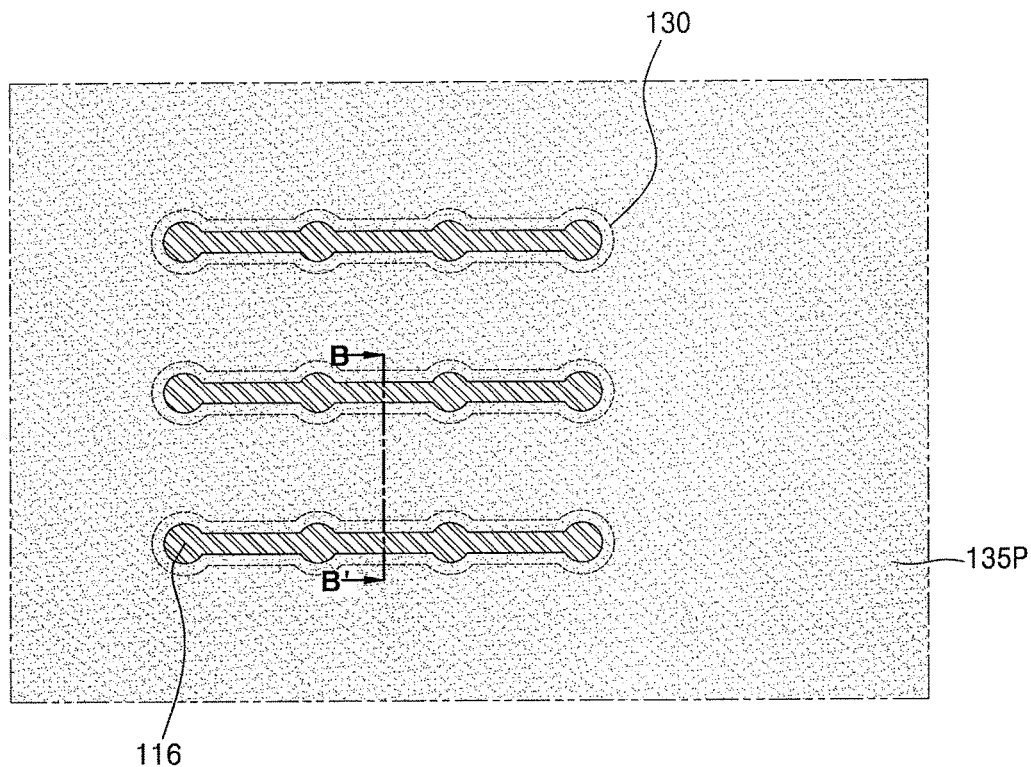
Figure 6B:
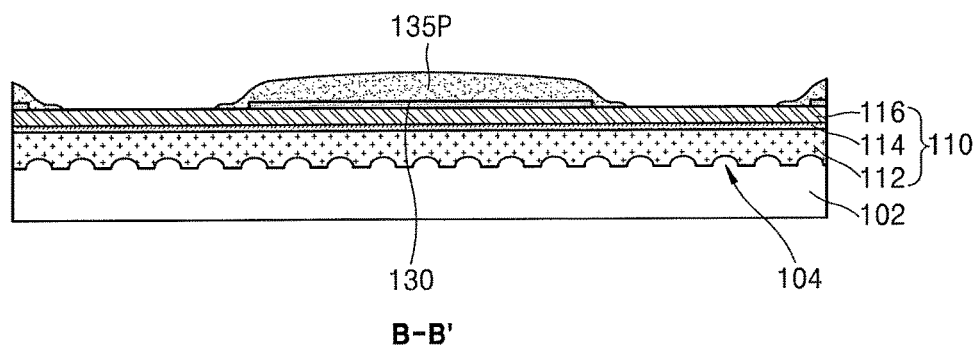

Referring to FIGS. 6A and 6B, the first mask pattern M1 (e.g., see FIGS. 5A and 5B) is removed. When removing the first mask pattern M1, a layer including the same material as the reflective electrode layer 130 and a layer including the same material as the transparent material layer 135P may be also removed. Thus, the reflective electrode layer 130 and the transparent material layer 135P may be formed by a lift-off method.

Figure 7A:
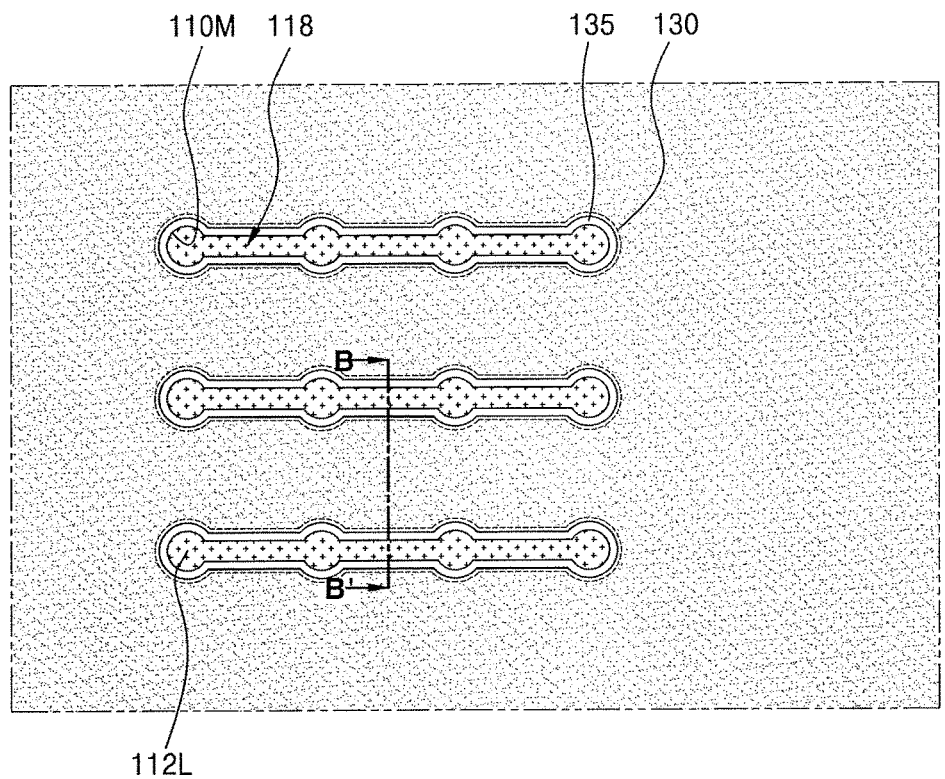
Figure 7B:
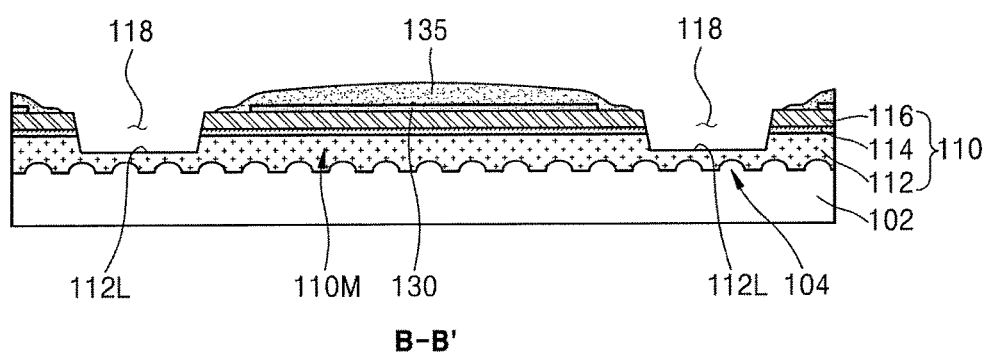

Referring to FIGS. 7A and 7B, a portion of each of the second semiconductor layer 116, the active layer 114, and the first semiconductor layer 112 is etched using the transparent material layer 135P (e.g., see FIGS. 6A and 6B) as an etching mask to form a plurality of trenches 118 defining the mesa structure 110M of the light-emitting structure 110. The lower surface portion 112L of the first semiconductor layer 112 may be exposed at a lower surface of the plurality of trenches 118.

When forming the plurality of trenches 118, a portion of the upper portion of the transparent material layer 135P is removed to form the transparent cover layer 135. The shape of the transparent cover layer 135 may correspond, for example, to that discussed with reference to FIG. 1C.

The transparent cover layer 135 may over the upper surface and the side surface of the reflective electrode layer 130. The transparent cover layer 135 may cover the reflective electrode layer 130 and a portion of the upper surface of the second semiconductor layer 116 that is adjacent to the reflective electrode layer 130. The transparent cover layer 135 may not cover a portion adjacent to the edge of the upper surface of the second semiconductor layer 116. The portion of the upper surface of the second semiconductor layer 116, that is not covered by the transparent cover layer 135 may be a portion where a portion of the transparent material layer 135P covering the upper surface of the second semiconductor layer 116 is entirely removed when forming the plurality of trenches 118. In some embodiments, after forming the plurality of trenches 118, the transparent cover layer 135 may entirely cover the upper surface of the second semiconductor layer 116.

Due to the transparent material layer 135P, the reflective electrode layer 130 may not be exposed to the etching atmosphere for forming the plurality of trenches 118. Furthermore, after the etching process is completed and the plurality of trenches 118 are formed, the transparent cover layer 135 (which is a remaining portion of the transparent material layer 135P) may cover the reflective electrode layer 130, so that the reflective electrode layer 130 may be prevented from being peeled off the upper surface of the second semiconductor layer 116.

The transparent material layer 135P formed using the first mask pattern M1 (e.g., see FIGS. 3A to 5B) is used as an etching mask without forming a mask pattern separately to form the plurality of trenches 118. Thus, the distance between the edge of the reflective electrode layer 130 and the edge of the upper surface of the second semiconductor layer 116 (e.g., the edge of the upper surface of the mesa structure 110M) may be configured to be relatively less.

Figure 8A:
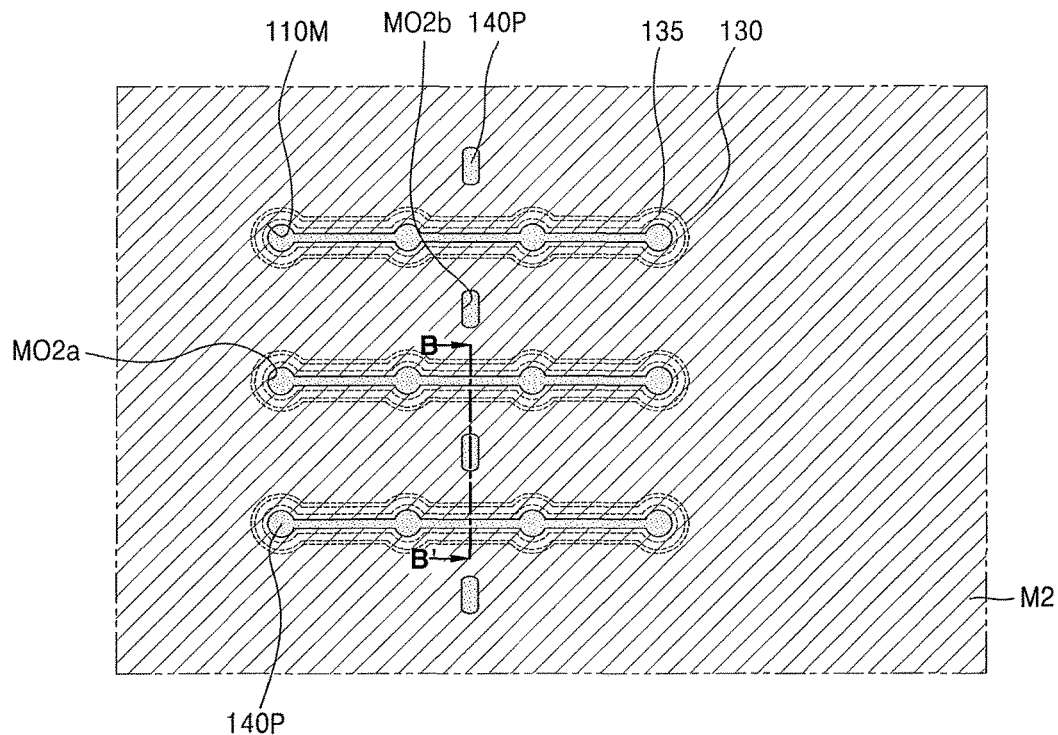
Figure 8B:
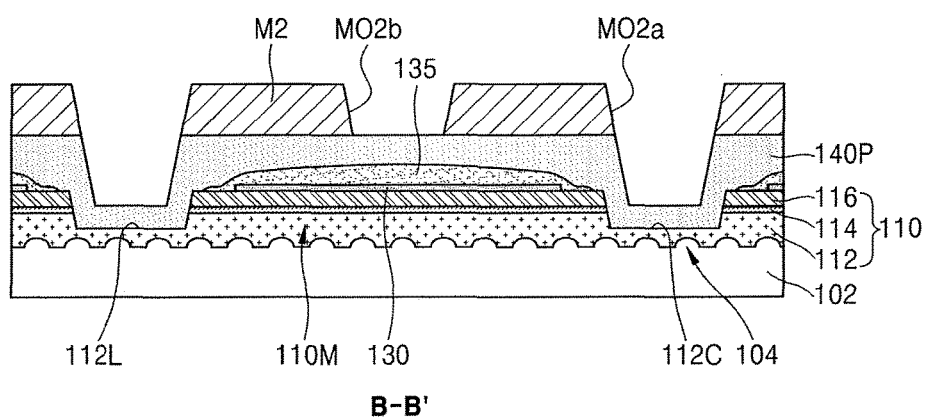

Referring to FIGS. 8A and 8B, the method further includes forming an insulating material layer 140P covering the light-emitting structure 110 on which the transparent cover layer 135 is formed. The insulating material layer 140P may be formed to entirely cover the upper surface of the light-emitting structure 110 on which the transparent cover layer 135 is formed. For example, the insulating material layer 140P may also cover the surface of the transparent cover layer 135, the upper surface of the second semiconductor layer 116, the side surface of the mesa structure 110M, and the lower surface portion 112L of the first semiconductor layer 112.

The insulating material layer 140P may include, but is not limited to, $SiO_2$, $Si_3N_4$, $MgF_2$, or a combination thereof. In some embodiments, the insulating material layer 140P may be formed by a plasma enhanced chemical vapor deposition (PECVD), a physical vapor deposition (PVD), or a spin coating process.

In some embodiments, the insulating material layer 140P may be a multi-layered film including the same material. In some embodiments, the insulating material layer 140P may be a multi-layered film including different materials. In some embodiments, the insulating material layer 140P may be a multi-layered film in which at least two films having different refractive indices are stacked. For example, when the insulating material layer 140P is the multi-layered film in which at least two films having different refractive indices are stacked, an upper film may have a larger refractive index than a lower film.

A second mask pattern M2 having first and second sub openings MO2a and MO2b is formed on the insulating material layer 140P. The first sub opening MO2a may overlap a portion of the lower surface portion 112L of the first semiconductor layer 112. The second sub opening MO2b may overlap a portion of the transparent cover layer 135.

Figure 9A:
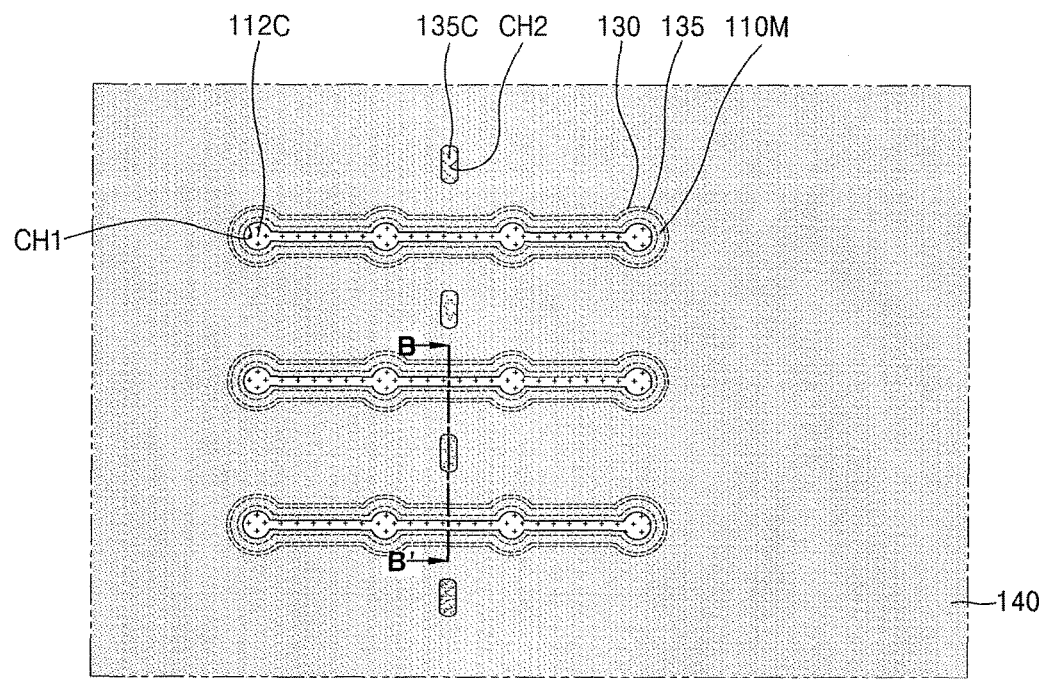
Figure 9B:
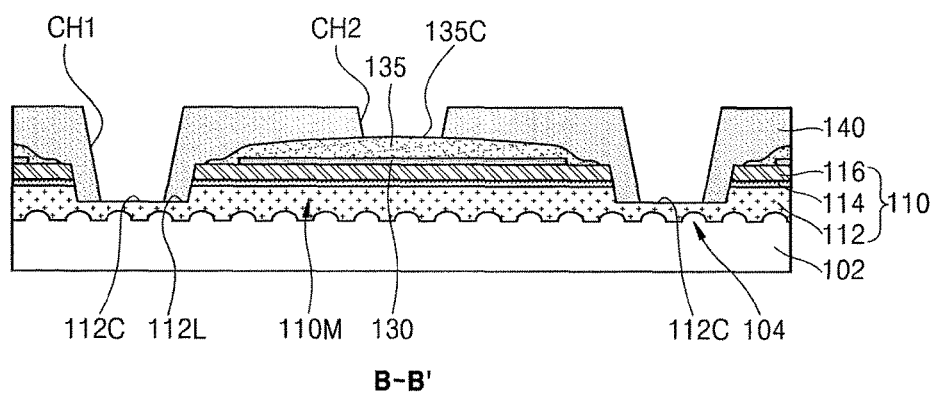

Referring to FIGS. 9A and 9B, a portion of the insulating material layer 140P (e.g., see FIGS. 8A and 8B) is removed using the second mask pattern M2 (e.g., see FIGS. 8A and 8B) as an etching mask to form the insulating structure 140. The insulating structure 140 includes the first contact hole CH1 exposing at least a portion of the first semiconductor layer 112 and the second contact hole CH2 exposing at least a portion of the transparent cover layer 135. The first contact region 112C is a portion of the lower surface portion 112L of the first semiconductor layer 112 and may be exposed at a lower surface of the first contact hole CH1. The second contact region 135C is a portion of the upper surface of the transparent cover layer 135 and may be exposed at a lower surface of the second contact hole CH2.

Figure 10A:
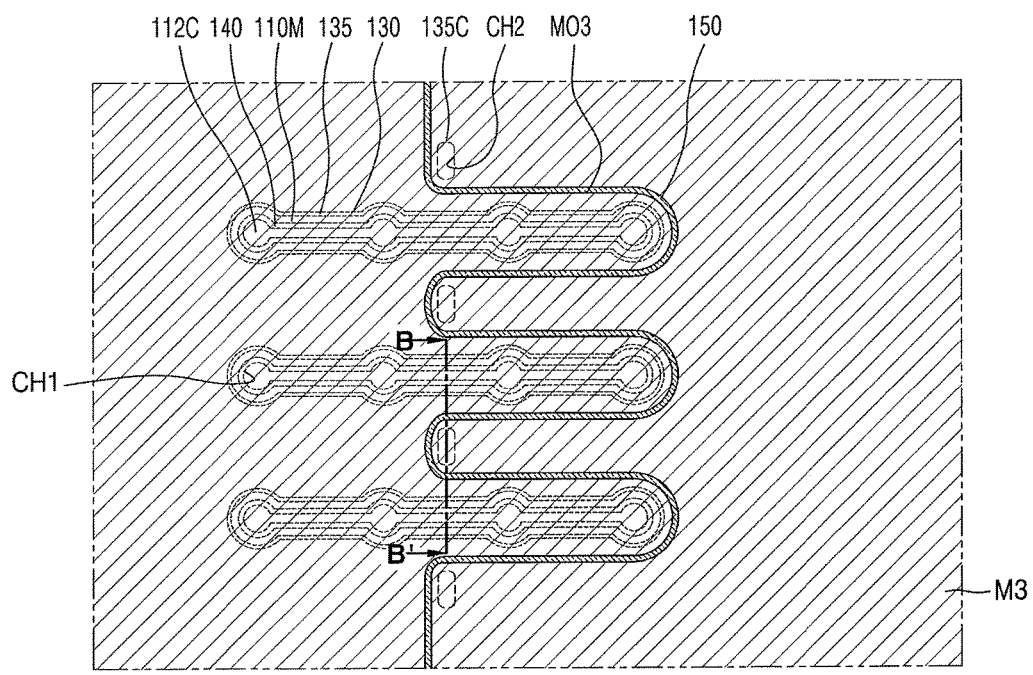
Figure 10B:
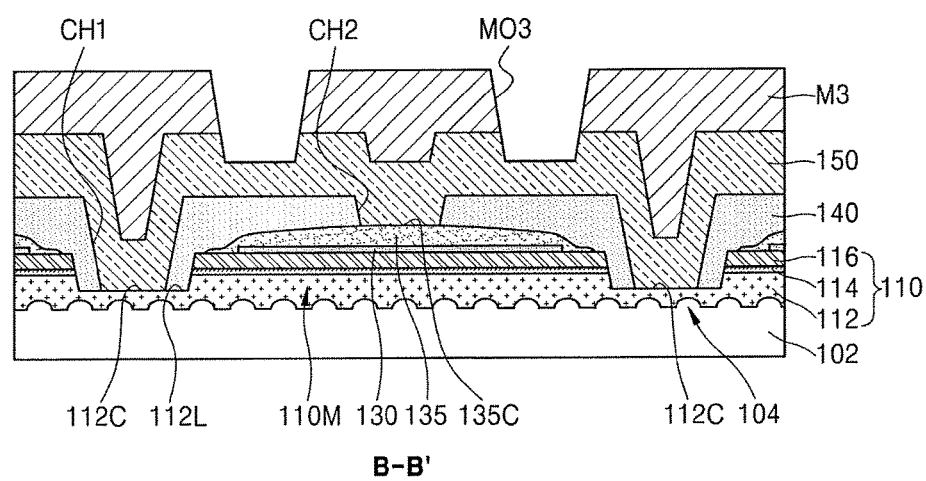

Referring to FIGS. 10A and 10B, the method includes forming a conductive material layer 150 covering the light-emitting structure 110 on which the insulating structure 140 is formed. The conductive material layer 150 may be formed to entirely cover the upper surface of the light-emitting structure 110 on which the insulating structure 140 is formed. For example, the conductive material layer 150 may cover the surface of the insulating structure 140, the portion of the lower surface portion 112L of the first semiconductor layer 112 exposed at the lower surface of the first contact hole CH1, and the portion of the upper surface of the transparent cover layer 135 exposed at the lower surface of the second contact hole CH2, together.

The conductive material layer 150 may contact the first contact region 112C and the second contact region 135C.

A third mask pattern M3 having a third opening MO3 is formed on the conductive material layer 150.

Then, a portion of the conductive material layer 150 is removed using the third mask pattern M3 as an etching mask until the insulating structure 140 is exposed through the third opening MO3 to form, as illustrated, for example, in FIGS. 1A and 1B, the first interconnection conductive layer 152 and the second interconnection conductive layer 154. As illustrated, the first interconnection conductive layer 152 and the second interconnection conductive layer 154 are spaced apart from, with the separation space 150G (e.g., see FIGS. 1A and 1B) therebetween. As a result, the semiconductor light-emitting device 100 is formed, e.g., see FIGS. 1A and 1B.

Figure 11:
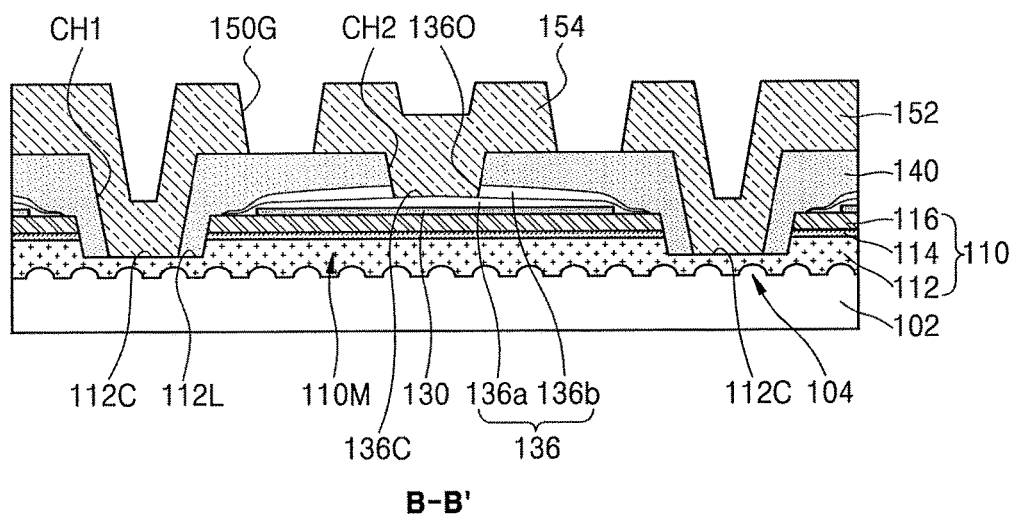
FIGS. 11 to 14 illustrate additional embodiments of a semiconductor light-emitting device.

FIGS. 11 to 14 illustrate additional embodiments of a semiconductor light-emitting devices taken along cross-sectional line B-B' of FIG. 1A. Referring to FIG. 11, a semiconductor light-emitting device 100a includes the substrate 102 and the light-emitting structure 110 on the substrate 102. The light-emitting structure 110 includes the first semiconductor layer 112, the active layer 114, and the second semiconductor layer 116. The light-emitting structure 110 includes the mesa structure 110M. In addition, the semiconductor light-emitting device 100a includes the reflective electrode layer 130 covering the upper surface of the second semiconductor layer 116 and a transparent cover layer 136 covering the reflective electrode layer 130. The transparent cover layer 136 may include a lower transparent cover layer 136a covering an upper surface of the reflective electrode layer 130 and an upper transparent cover layer 136b covering an upper surface of the lower transparent cover layer 136a.

In some embodiments, the lower transparent cover layer 136a may include conductive oxide. In some embodiments, the upper transparent cover layer 136b may include an insulating material. In some embodiments, the upper transparent cover layer 136b may include $SiO_2$, $Si_3N_4$, $MgF_2$, or a combination thereof.

The upper transparent cover layer 136b may be connected to the second contact hole CH2 and have a contact extension hole 136O exposing a portion of the lower transparent cover layer 136a. A second contact region 136C of the lower transparent cover layer 136a may be exposed through the contact extension hole 136O. The shape of the transparent cover layer 136 may be similar to the shape of the transparent cover layer 135 described with reference to FIGS. 1A to 1C, except for the contact extension hole 136O.

The semiconductor light-emitting device 100a includes the insulating structure 140 that covers the upper surface of the second semiconductor layer 116 around the transparent cover layer 135 and has the first contact hole CH1 and the second contact hole CH2. The first contact region 112C of the first semiconductor layer 112 may be exposed through the first contact hole CH1. The second contact hole CH2 and the second contact region 136C of the transparent cover layer 136 may be exposed through the contact extension hole 136O.

The semiconductor light-emitting device 100a includes the first interconnection conductive layers 152 that are spaced apart from each other, with the separation space 150G therebetween, and contacts the first contact region 112C of the first semiconductor layer 112 through the insulating structure 140. The second interconnection conductive layer 154 contacts the second contact region 136C of the lower transparent cover layer 136a through the insulating structure 140 and the upper transparent cover layer 136b.

Figure 12:
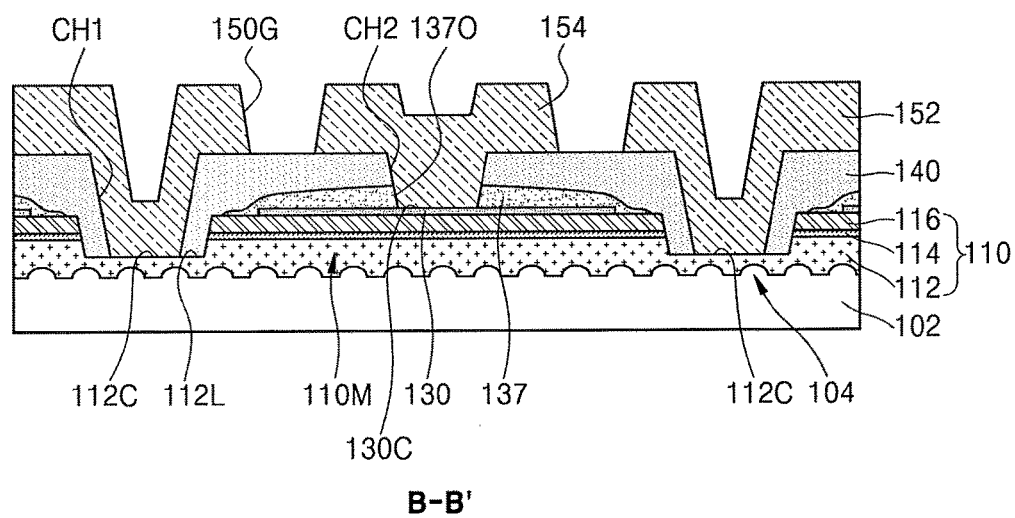

Referring to FIG. 12, a semiconductor light-emitting device 100b includes the substrate 102 and the light-emitting structure 110 on the substrate 102. The light-emitting structure 110 includes the first semiconductor layer 112, the active layer 114, and the second semiconductor layer 116. The light-emitting structure 110 includes the mesa structure 110M. In addition, the semiconductor light-emitting device 100a includes the reflective electrode layer 130 covering the upper surface of the second semiconductor layer 116 and a transparent cover layer 137 covering the reflective electrode layer 130.

In some embodiments, the transparent cover layer 137 may include an insulating material. In some embodiments, the transparent cover layer 137 may include $SiO_2$, $Si_3N_4$, $MgF_2$, or a combination thereof.

The transparent cover layer 137 may be connected to the second contact hole CH2 and may include a contact extension hole 137O exposing a portion of the reflective electrode layer 130. A second contact region 130C of the reflective electrode layer 130 may be exposed through the contact extension hole 136O. The shape of the transparent cover layer 137 may be similar to the shape of the transparent cover layer 135 described with reference to FIGS. 1A to 1C, except for the contact extension hole 137O.

The semiconductor light-emitting device 100b includes the insulating structure 140 that covers the upper surface of the second semiconductor layer 116 around the transparent cover layer 137 and has the first contact hole CH1 and the second contact hole CH2. The first contact region 112C of the first semiconductor layer 112 may be exposed through the first contact hole CH1. The second contact region 136C of the transparent cover layer 136 may be exposed through the second contact hole CH2 and the contact extension hole 137O.

The semiconductor light-emitting device 100b includes the first interconnection conductive layers 152 that are spaced apart from each other, with the separation space 150G therebetween, and contacts the first contact region 112C of the first semiconductor layer 112 through the insulating structure 140, and the insulating structure 140 and the second interconnection conductive layer 154 that contacts the second contact region 130C of the reflective electrode layer 130 through the transparent cover layer 137.

Figure 13:
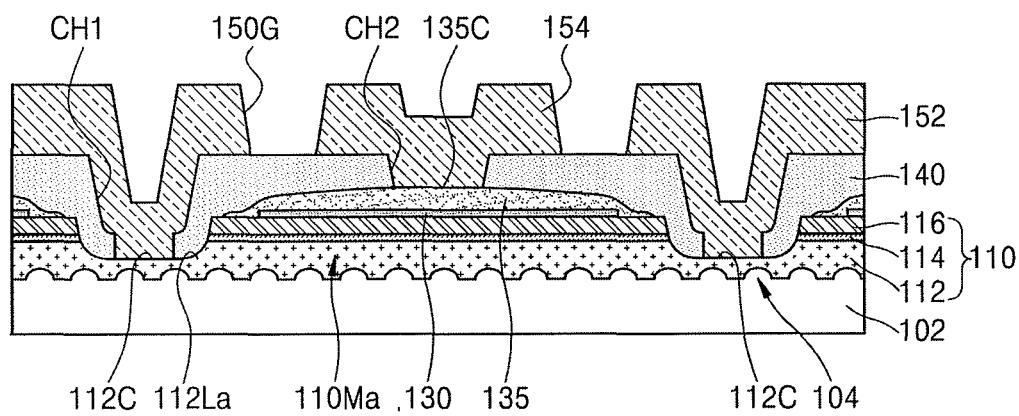

Referring to FIG. 13, a semiconductor light-emitting device 100c includes the substrate 102 and the light-emitting structure 110 on the substrate 102. The light-emitting structure 110 includes the first semiconductor layer 112, the active layer 114, and the second semiconductor layer 116. The light-emitting structure 110 includes a mesa structure 110Ma. As compared to the mesa structure 110M of the semiconductor light-emitting device 100 of FIG. 1B, a side wall of the mesa structure 110Ma of the semiconductor light-emitting device 100c may have a rounded shape. For example, the side wall of the mesa structure 110Ma may have a concavely rounded shape. The lower surface portion 112L of the first semiconductor layer 112 may have a concave shape in which a center is lower than a portion adjacent to the edge.

The semiconductor light-emitting device 100c further includes the reflective electrode layer 130 covering the upper surface of the second semiconductor layer 116 and the transparent cover layer 135 covering the reflective electrode layer 130. The semiconductor light-emitting device 100c includes the insulating structure 140 that covers the upper surface of the second semiconductor layer 116 around the transparent cover layer 135 and has the first contact hole CH1 and the second contact hole CH2. The first contact region 112C of the first semiconductor layer 112 may be exposed through the first contact hole CH1. The second contact region 135C of the transparent cover layer 135 may be exposed through the second contact hole CH2.

The semiconductor light-emitting device 100c includes the first interconnection conductive layers 152 that are spaced apart from each other with the separation space 150G interposed therebetween and contacts the first contact region 112C of the first semiconductor layer 112 through the insulating structure 140 and the second interconnection conductive layer 154 that contacts the second contact region 135C of the transparent cover layer 135 through the insulating structure 140.

Figure 14:
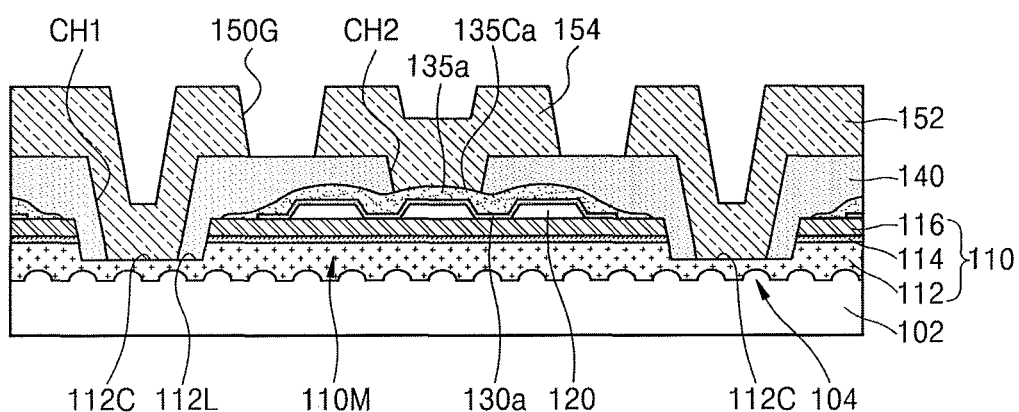

Referring to FIG. 14, a semiconductor light-emitting device 100d includes the substrate 102 and the light-emitting structure 110 on the substrate 102. The light-emitting structure 110 includes the first semiconductor layer 112, the active layer 114, and the second semiconductor layer 116. The light-emitting structure 110 includes the mesa structure 110M. In addition, the semiconductor light-emitting device 100d includes a plurality of insulating patterns 120, a reflective electrode layer 130a, and a transparent cover layer 135a. The plurality of insulating patterns 120 are on the upper surface of the second semiconductor layer 116 and are spaced apart from each other. The reflective electrode layer 130a covers the plurality of insulating patterns 120 and the upper surface of the second semiconductor layer 116. The transparent cover layer 135a covers the reflective electrode layer 130a. The plurality of insulating patterns 120 may include, for example, $SiO_2$, $Si_3N_4$, $MgF_2$, or a combination thereof.

The reflective electrode layer 130a may extend along an upper surface and a side surface of each of the plurality of insulating patterns 120 and the upper surface of the second semiconductor layer 116. Upper surfaces of the plurality of insulating patterns 120 are transferred. Thus, the transparent cover layer 135a has a shape having an upper surface and a lower surface with step differences. The shape of the transparent cover layer 135a (and especially the shape around the edge) is similar to the shape of the transparent cover layer 135, for example, described with reference to FIGS. 1A to 1C, except that the upper surfaces of the plurality of insulating patterns 120 are transferred.

The plurality of insulating patterns 120 and the reflective electrode layer 130a may constitute, for example, an omnidirectional reflector (ODR) structure. In the semiconductor light-emitting device 100d, light emitted from the upper surface of the second semiconductor layer 116 of light emitted from the active layer 114 may be reflected by the ODR structure including the plurality of insulating patterns 120 and the reflective electrode layer 130a.

In some embodiments, each of the plurality of insulating patterns 120 may be a multi-layered film in which at least two films having different refractive indices are stacked. In this case, in the multi-layered film including the plurality of insulating patterns 120, an upper film may have a larger refractive index than a lower film.

The semiconductor light-emitting device 100d includes the insulating structure 140 that covers the upper surface of the second semiconductor layer 116 around the transparent cover layer 135a and has the first contact hole CH1 and the second contact hole CH2. The first contact region 112C of the first semiconductor layer 112 may be exposed through the first contact hole CH1. A second contact region 135Ca of the transparent cover layer 135a may be exposed through the second contact hole CH2.

The semiconductor light-emitting device 100b includes the first interconnection conductive layers 152 that are spaced apart from each other, with the separation space 150G therebetween, and contacts the first contact region 112C of the first semiconductor layer 112 through the insulating structure 140, and the insulating structure 140 and the second interconnection conductive layer 154 that contacts the second contact region 130C of the reflective electrode layer 130a through the transparent cover layer 135a.

Figure 15A:
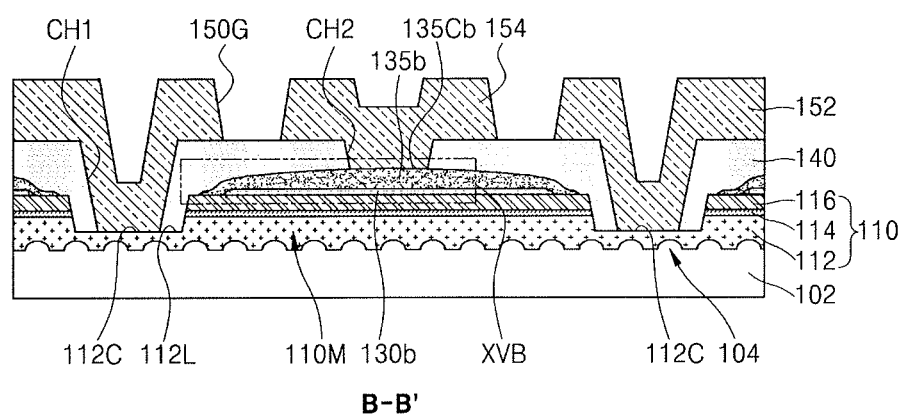
FIG. 15A illustrates a cross-sectional view of another embodiment of a semiconductor light-emitting device.
Figure 15B:
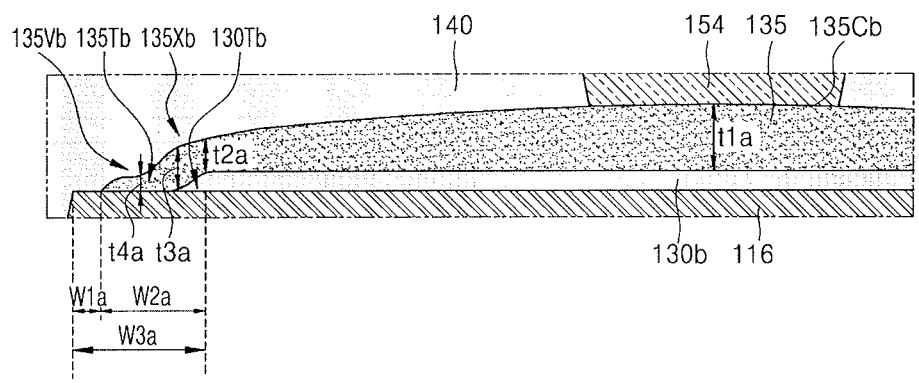
FIG. 15B illustrates an enlarged view of an XVB region of FIG. 15A.

FIG. 15A illustrates a cross-sectional view showing another embodiment of a semiconductor light-emitting device 200, and particularly a cross-sectional view of a position corresponding to line B-B' of FIG. 1A. FIG. 15B illustrates an enlarged view of an embodiment of a XVB portion in FIG. 15A.

Referring to FIGS. 15A and 15B, the semiconductor light-emitting device 200 includes a light-emitting structure 110 on a substrate 102. The light-emitting structure 110 includes the first semiconductor layer 112, the active layer 114, and the second semiconductor layer 116. The light-emitting structure 110 includes the mesa structure 110M. In addition, the semiconductor light-emitting device 200 includes a reflective electrode layer 130b covering the upper surface of the second semiconductor layer 116, and a transparent cover layer 135b covering the reflective electrode layer 130b.

The semiconductor light-emitting device 200 includes the insulating structure 140 that covers the upper surface of the second semiconductor layer 116 around the transparent cover layer 135b and has the first contact hole CH1 and the second contact hole CH2. The first contact region 112C of the first semiconductor layer 112 may be exposed through the first contact hole CH1. A second contact region 135Cb of the transparent cover layer 135b may be exposed through the second contact hole CH2.

The semiconductor light-emitting device 100b includes the first interconnection conductive layers 152 that are spaced apart from each other, with the separation space 150G therebetween, and contacts the first contact region 112C of the first semiconductor layer 112 through the insulating structure 140, and the second interconnection conductive layer 154 that contacts the second contact region 135Cb of the transparent cover layer 135b through the insulating structure 140.

For example, the reflective electrode layer 130b may be formed by a sputtering deposition method. For example, the reflective electrode layer 130b may be formed by a tilted sputtering deposition method. The reflective electrode layer 130b may include around the edge thereof a first tail portion 130Tb having a thickness which decreases toward the edge thereof.

The transparent cover layer 135b may have a first thickness t1a around a center of a horizontal direction or at a portion of the second contact region 135Cb, a second thickness t2a on a portion adjacent to the inner portion of the edge of the reflective electrode layer 130b, a third thickness t3a on the edge of the reflective electrode layer 130b or on a portion adjacent to the outer portion of the edge of the reflective electrode layer 130b, and a fourth thickness t4a on the second semiconductor layer 116 spaced apart from the edge of the reflective electrode layer 130b.

The first thickness t1a may be the largest thickness of the transparent cover layer 135b, e.g., the first thickness t1a may be larger than the second to fourth thicknesses t2a, t3a, and t4a. The second thickness t2a may be less than the third thickness t3a. The fourth thickness t4a may be less than the second thickness t2a and the third thickness t3a. Thus, the thickness of the transparent cover layer 135b may decrease from the center to the edge, increase around the edge of the reflective electrode layer 130b, and then decrease again toward the edge.

The transparent cover layer 135b may include, around the edge, a second tail portion 135Tb extending from the edge of the reflective electrode layer 130b to the edge of the transparent cover layer 135b. The second tail portion 135Tb of the transparent cover layer 135b may entirely cover the edge of the reflective electrode layer 130b, particularly, the first tail portion 130Tb of the reflective electrode layer 130b.

In some embodiments, the transparent cover layer 135b may include a first portion 135Xb having a convex upper surface on the edge of the reflective electrode layer 130b, or on a portion adjacent to the outer portion of the edge of the reflective electrode layer 130b, e.g., a portion having the third thickness t3a. In some embodiments, the transparent cover layer 135b may include the second contact region 135Cb having a concave upper surface on a portion adjacent to the edge.

The transparent cover layer 135b may include the first portion 135Xb sequentially having convex upper surfaces and the second portion 135Vb having a concave upper surface on a portion extending from a portion around the edge of the reflective electrode layer 130b toward the edge of the transparent cover layer 135b. The edge of the reflective electrode layer 130b may be protected by the first portion 135Xb and the second portion 135Vb corresponding to the second tail portion 135Tb of the transparent cover layer 135b. Thus, the reflective electrode layer 130b may be prevented from being peeled off the upper surface of the second semiconductor layer 116.

The edge of the upper surface of the second semiconductor layer 116 and the edge of the transparent cover layer 135b may be spaced apart by a first distance W1a. The edge of the transparent cover layer 135b and the edge of the reflective electrode layer 130b may be spaced apart from each other by a second distance W2a. In some embodiments, the first distance W1a may be equal to or less than 1 μm. In some embodiments, the second distance W2a may be equal to or less than 1 μm. The edge of the upper surface of the second semiconductor layer 116 and the edge of the reflective electrode layer 130b may be spaced apart from each other by a third distance W3a, which is the sum of the first distance W1a and the second distance W2a. In some embodiments, the third distance W3a may be equal to or less than 2 μm.

In some embodiments, the third distance W3a of the semiconductor light-emitting device 200 may be less than the third distance W3 of the semiconductor light-emitting device 100 described with reference to FIGS. 1A to 1C. The distances may be different in other embodiments.

Figure 16A:
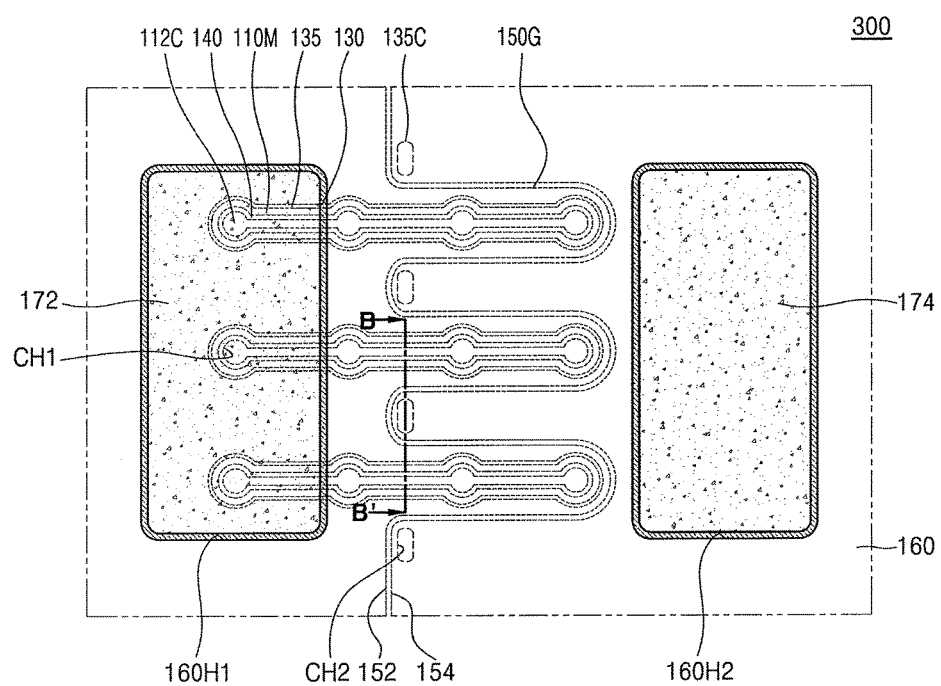
FIG. 16A illustrates another embodiment of a method for manufacturing a semiconductor light-emitting device.
Figure 16B:
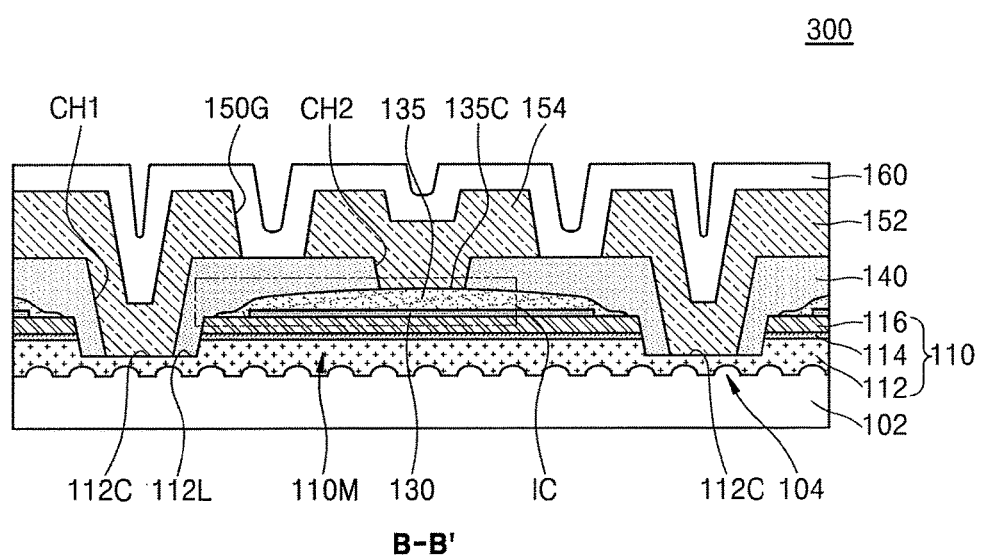
FIG. 16B illustrates a cross-sectional view taken along a line B-B' of FIG. 16A.

FIG. 16A illustrates another embodiment of a method for manufacturing a semiconductor light-emitting device 300, and FIG. 16B illustrates a cross-sectional view taken along line B-B' of FIG. 16A.

Referring to FIGS. 16A and 16B, a semiconductor light-emitting device 300 includes a light-emitting structure 110 on the substrate 102. The light-emitting structure 110 includes the first semiconductor layer 112, the active layer 114, and the second semiconductor layer 116. The light-emitting structure 110 includes the mesa structure 110M. In addition, the semiconductor light-emitting device 100a includes the reflective electrode layer 130 covering the upper surface of the second semiconductor layer 116, and the transparent cover layer 135 covering the reflective electrode layer 130.

The semiconductor light-emitting device 300 includes the insulating structure 140 that covers the upper surface of the second semiconductor layer 116 around the transparent cover layer 135 and has the first contact hole CH1 and the second contact hole CH2. The first contact region 112C of the first semiconductor layer 112 may be exposed through the first contact hole CH1. The second contact region 135C of the transparent cover layer 135 may be exposed through the second contact hole CH2.

The semiconductor light-emitting device 300 includes the first interconnection conductive layers 152 that are spaced apart from each other, with the separation space 150G therebetween, and contacts the first contact region 112C of the first semiconductor layer 112, and the second interconnection conductive layer 154 that contacts the second contact region 135C of the transparent cover layer 135.

The semiconductor light-emitting device 300 further includes a passivation layer 160 covering the first interconnection conductive layer 152 and the second interconnection conductive layer 154, a first bonding conductive layer 172 connected to the first interconnection conductive layer 152 through a first bonding hole 160H1 formed on the passivation layer 160, and a second bonding conductive layer 174 connected to the second interconnection conductive layer 154 through a second bonding hole 160H2 formed on the passivation layer 160. In another embodiment, the planar shapes of the first bonding hole 160H1 and the second bonding hole 160H2, and the first bonding conductive layer 172 and the second bonding conductive layer 174, may be different from the that illustrated in FIG. 16A.

The passivation layer 160 may include, but is not limited to, a silicon oxide.

Each of the first bonding conductive layer 172 and the second bonding conductive layer 174 may include a single film including a single material of, for example, Au, Sn, Ni, Pb, Ag, In, Cr, Ge, Si, Ti, W, and Pt, or an alloy including at least two of these materials, or a multi-layered film including a combination thereof.

In some embodiments, the first bonding conductive layer 172 and the second bonding conductive layer 174 may include a multiple metal film in which a Ti film, a first Ni film, a second Ni film, and an Au film are sequentially stacked. The first Ni film and the second Ni film may be Ni films formed by different deposition processes. For example, the first Ni film may be a Ni film formed by a sputtering process, and the second Ni film may be a Ni film formed by a DVD process using electron beam evaporation.

In some embodiments, each of the first bonding conductive layer 172 and the second bonding conductive layer 174 may include at least two of a conductive barrier layer, a conductive adhesive layer, a conductive coupling layer, and a conductive bonding layer. The conductive barrier layer may include at least one of a Ti layer, at least one pair of Ti/Pt bilayers, at least one pair of Ti/W bilayers, at least one pair of TiN/W bilayers, at least one pair of W/TiW bilayers, and a Ni layer. The conductive adhesive layer may include Ti. The conductive coupling layer may be between the conductive adhesive layer and the conductive bonding layer and may include Ni or Ni/Au. The conductive bonding layer may include, for example, Au—Sn alloy, Ni—Sn alloy, Ni—Au—Sn alloy, Pb—Ag—In alloy, Pb—Ag—Sn alloy, Pb—Sn alloy, Au—Ge alloy, or Au—Si alloy. The first bonding conductive layer 172 and the second bonding conductive layer 174 may be made of different materials or have a different configuration in other embodiments.

The semiconductor light-emitting device 300 of FIGS. 16A and 16B may include the transparent cover layer 136 of FIG. 11, instead of the transparent cover layer 135. The semiconductor light-emitting device 300 of FIGS. 16A and 16B may include the transparent cover layer 137 of FIG. 12, instead of the transparent cover layer 135. The semiconductor light-emitting device 300 of FIGS. 16A and 16B may include the mesa structure 110Ma of FIG. 13, instead of the mesa structure 110M.

The semiconductor light-emitting device 300 of FIGS. 16A and 16B may further include the plurality of insulating patterns 120 of FIG. 14, and may include the reflective electrode layer 130a and the transparent cover layer 135a of FIG. 14 instead of the reflective electrode layer 130 and the transparent cover layer 135. The semiconductor light-emitting device 300 of FIGS. 16A and 16B may include the reflective electrode layer 130b and the transparent cover layer 135b of FIG. 15, instead of the reflective electrode layer 130 and the transparent cover layer 135.

In order to manufacture the semiconductor light-emitting device 300 of FIGS. 16A and 16B, the processes described with reference to FIGS. 2A to 10B may be performed to form the passivation layer 160 covering the first interconnection conductive layer 152 and the second interconnection conductive layer 154. CVD, PVD, or another deposition process may be used, for example, to form the passivation layer 160.

Then, a portion of the passivation layer 160 is removed to form the first bonding hole 160H1 (exposing the first interconnection conductive layer 152 and the second bonding hole 160H2 exposing the second interconnection conductive layer 154), and to form the first bonding conductive layer 172 connected to the first interconnection conductive layer 152 through the first bonding hole 160H1 and the second bonding conductive layer 174 connected to the second interconnection conductive layer 154 through the second bonding hole 160H2.

The semiconductor light-emitting devices 100, 100a, 100b, 100c, 100d, 200, and 300 described with reference to FIGS. 1A to 16B have a structure in which the reflective electrode layers 130, 130a, and 130b are capped with the transparent cover layers 135, 135a, and 135b. Thus, due to the excellent adhesion properties of the second semiconductor layer 116 of the mesa structures 110M and 110Ma and the transparent cover layers 135, 135a, and 135b, peeling-off of the reflective electrode layers 130, 130a, and 130b, or migration or agglomeration of a metal material in the reflective electrode layers 130, 130a, and 130b may be reduced. As a result, reliability of the reflective electrode layers 130, 130a, and 130b and adhesive force between the reflective electrode layers 130, 130a, and 130b and the mesa structures 110M and 110Ma may be may be improved to produce a more stable structure.

In addition, the distance between the edges of the reflective electrode layers 130, 130a, and 130b and the edge of the upper surface of the second semiconductor layer 116 (e.g., the distance between edges of the upper surface of the mesa structures 110M and 36-110Ma) may be relatively small. Thus, a reflective area by the reflective electrode layers 130, 130a, and 130b is increased to improve light extraction efficiency of the semiconductor light-emitting devices 100, 100a, 100b, 100c, 100d, 200, and 300.

Figure 17:
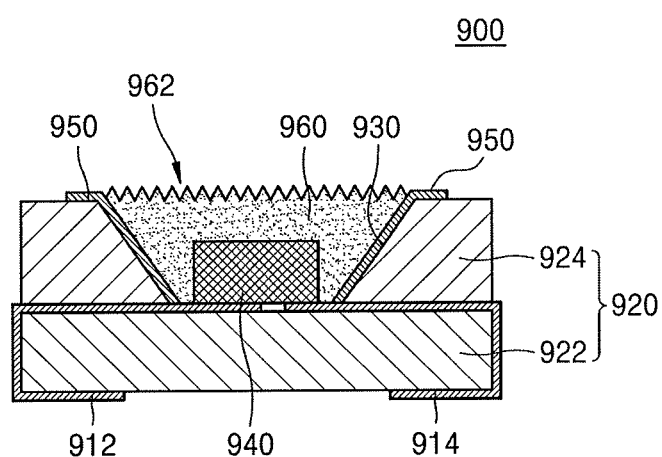
FIG. 17 illustrates an embodiment of a light-emitting device package.

FIG. 17 illustrates a cross-sectional view of an embodiment of a light-emitting device package 900 including a semiconductor light-emitting device. Referring to FIG. 17, the light-emitting device package 900 includes a cup-shaped package structure 920 in which electrode patterns 912 and 914 are formed. The cup-shaped package structure 920 includes a lower substrate 922 in which the electrode patterns 912 and 914 are formed on a surface and an upper substrate 924 having a groove portion 930.

A semiconductor light-emitting device 940 is mounted on a lower surface of the groove portion 930 by flip-chip method. The semiconductor light-emitting device 940 may include, for example, one or more of the semiconductor light-emitting devices 100, 100a, 100b, 100c, 100d, 200, and 300 described with reference to FIGS. 1A to 16B.

The semiconductor light-emitting device 940 may be fixed onto the electrode patterns 912 and 914, for example, by eutectic bonding. For example, the electrode patterns 912 and 914 may be connected to the first and second interconnection conductive layers 152 and 154 or the first and second bonding conductive layers 172 and 174, described with reference to FIGS. 1A to 16B.

A reflective plate 950 is formed on an inner side wall of the groove portion 930. The semiconductor light-emitting device 940 is covered by a transparent resin 960 filling the groove portion 930 on the reflective plate 950. An uneven pattern 962 is formed is formed on a surface of the transparent resin 960 to improve light extraction efficiency. In some embodiments, the uneven pattern 962 may be omitted.

The light-emitting device package 900 may be used as a color (e.g., blue) LED with high power/high efficiency and, for example, may be used to implement large displays, LED TVs, RGB white lighting, emotional lighting, etc.

Figure 18:
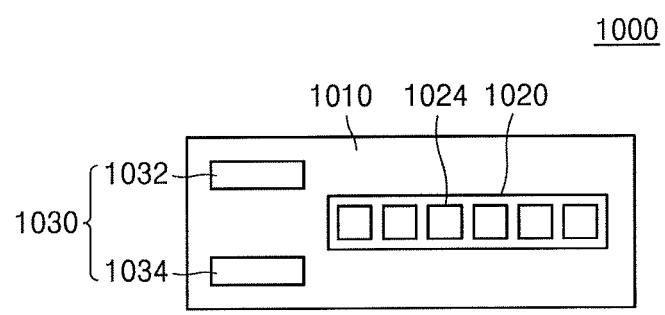
FIG. 18 illustrates an embodiment of a dimming system.

FIG. 18 illustrates an embodiment of a dimming system 1000 which includes a semiconductor light-emitting device. Referring to FIG. 18, the dimming system 1000 includes a light-emitting module 1020 and a power supply unit 1030 on a structure 1010.

The light-emitting module 1020 includes a plurality of light-emitting device packages 1024. The plurality of light-emitting device packages 1024 include, for example, one or more of the semiconductor light-emitting devices 100, 100a, 100b, 100c, 100d, 200, and 300 described with reference to FIGS. 1A to 16B.

The power supply unit 1030 includes an interface 1032 to receive power and a power control unit 1034 that controls power supplied to the light-emitting module 1020. The interface 1032 may include a fuse to block overcurrent and an electromagnetic interference shielding filter to shield the electromagnetic interference signal. The power control unit 1034 may include a rectifying part and a smoothing part for converting an alternating current into a direct current when the alternating current is input as a power source, and a constant voltage controller for converting the voltage into a voltage suitable for the light-emitting module 1020. The power supply unit 1030 may include a feedback circuit device that performs a comparison of the amount of light emission from the plurality of light-emitting device packages 1024 with a predetermined amount of light, and a memory device to store brightness, color rendering, and/or other information.

In some embodiments, the dimming system 1000 may be used as an outdoor lighting device, a backlight unit used in a display device such as a liquid crystal display having an image panel, an indoor lighting device such as a lamp or flat panel light, and an outdoor lighting device such as a street lamp or sign. In some embodiments, the dimming system 1000 may be used for a lighting device for various kinds of transport vehicles, including but not limited to automobiles, ships, and aircraft. The dimming system 1000 may also be used for TVs, refrigerators, medical equipment, and other appliances.

Figure 19:
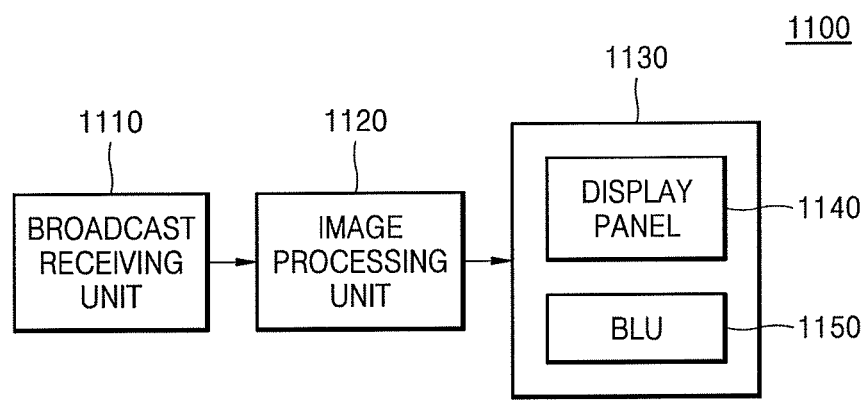
FIG. 19 illustrates an embodiment of a display apparatus.

FIG. 19 illustrates an embodiment of a display device 1100 including a semiconductor light-emitting device.

Referring to FIG. 19, the display device 1100 includes a broadcast receiving unit 1110, an image processing unit 1120 and a display 1130. The display 1130 includes a display panel 1140 and a back light unit (BLU) 1150. The BLU 1150 includes light sources generating light and driving elements driving these light sources.

The broadcast receiving unit 1110 selects a broadcast channel, received via wireless or wired communication through air or cable, from among a plurality of channels as an input channel and receives a broadcast signal of the channel set as the input channel.

The image processing unit 1120 performs signal processing such as video decoding, video scaling, and frame rate conversion (FRC) on broadcast content output from the broadcast receiving unit 1110.

The display panel 1140 includes, but is not limited to, a liquid crystal display (LCD). The display panel 1140 displays the broadcast content subjected to signal processing by the image processing unit 1120. The BLU 1150 projects light to the display panel 1140 so that the display panel 1140 displays an image. The BLU 1150 includes the semiconductor light-emitting devices 100, 100a, 100b, 100c, 100d, 200, and 300 described with reference to FIGS. 1A to 16B.

In accordance with one or more of the aforementioned embodiments, a semiconductor light-emitting device includes a reflective electrode layer capped with a transparent cover layer. Thus, due to the excellent adhesion properties of a second semiconductor layer of a mesa structure and a transparent cover layer, peeling-off of the reflective electrode layer and/or migration or agglomeration of metal material in the reflective electrode layer may be reduced to improve reliability of the reflective electrode layer. Also, adhesive force between a reflective electrode layer and a mesa structure may be physically enhanced to have a relatively stable structure.

Also, a separate mask pattern may not be used to form a plurality of trenches defining a mesa structure, Thus, the distance between an edge of a reflective electrode layer and an edge of an upper surface of the second semiconductor layer (e.g., an edge of an upper surface of the mesa structure) may be relatively small. Thus, a reflective area by the reflective electrode layer increases to improve light extraction efficiency of the semiconductor light-emitting device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor light-emitting device, comprising
a light-emitting structure including a first semiconductor layer, an active layer, and a second semiconductor layer;
a reflective electrode layer covering an upper surface of the second semiconductor layer; and
a transparent cover layer covering the upper surface of the second semiconductor layer and an upper surface of the reflective electrode layer, wherein the transparent cover layer includes a tail portion including a first portion and a second portion, the first portion covering an edge of the reflective electrode layer and a convex upper surface, the second portion being thinner than and extending from the first portion.

2. The semiconductor light-emitting device as claimed in claim 1, wherein the first portion of the transparent cover layer is thicker than other portions around the first portion of the transparent cover layer.

3. The semiconductor light-emitting device as claimed in claim 1, wherein the transparent cover layer has:
a first thickness at a center with respect to a horizontal direction,
a second thickness being less than the first thickness on a portion around the edge of the reflective electrode layer, which is an inner portion than the first portion,
a third thickness being less than the first thickness and greater than the second thickness on the first portion, and
a fourth thickness being less than the third thickness on the second portion.

4. The semiconductor light-emitting device as claimed in claim 1, further comprising
a plurality of insulating patterns spaced apart from each other between the second semiconductor layer and the reflective electrode layer, the plurality of insulating patterns having an omni-directional reflector (ODR) structure with the reflective electrode layer.

5. The semiconductor light-emitting device as claimed in claim 1, wherein:
the light-emitting structure includes a mesa structure defined by a plurality of trenches exposing a lower surface portion of the first semiconductor layer, and
the edge of the reflective electrode layer is spaced apart from an edge of an upper surface of the mesa structure.

6. The semiconductor light-emitting device as claimed in claim 5, wherein an edge of the transparent cover layer is spaced apart from the edge of the upper surface of the mesa structure.

7. The semiconductor light-emitting device as claimed in claim 6, wherein:
a first distance corresponds to a distance between the edge of the upper surface of the mesa structure and the edge of the transparent cover layer,
a second distance corresponds to a distance between the edge of the upper surface of the mesa structure and the edge of the reflective electrode layer, and
the first distance is less than the second distance.

8. The semiconductor light-emitting device as claimed in claim 7, wherein a value of the first distance is greater than 0 μm and less than 2 μm.

9. The semiconductor light-emitting device as claimed in claim 1, further comprising:
an insulating structure covering an upper surface of the first semiconductor layer and the upper surface of the second semiconductor layer around the transparent cover layer;
a first interconnection conductive layer electrically connected to the first semiconductor layer through the insulating structure; and
a second interconnection conductive layer electrically connected to the reflective electrode layer through the insulating structure.

10. The semiconductor light-emitting device as claimed in claim 9, wherein:
the transparent cover layer includes an insulating material, and
the second interconnection conductive layer contacts the reflective electrode layer through the transparent cover layer.

11. The semiconductor light-emitting device as claimed in claim 9, wherein:
the transparent cover layer includes a conductive oxide, and
the second interconnection conductive layer contacts the transparent cover layer.

12. The semiconductor light-emitting device as claimed in claim 9, wherein the transparent cover layer includes:
a lower transparent cover layer covering the reflective electrode layer and includes a conductive oxide, and
an upper transparent cover layer covering the lower transparent cover layer and including an insulating material, and
wherein the second interconnection conductive layer contacts the lower transparent cover layer through the upper transparent cover layer.

13. A semiconductor light-emitting device, comprising
a light-emitting structure including a first semiconductor layer, an active layer, a second semiconductor layer, and a mesa structure defined by a plurality of trenches exposing a lower surface portion of the first semiconductor layer;
a reflective electrode layer covering an upper surface of the mesa structure and spaced apart from an edge of the upper surface of the mesa structure; and
a transparent cover layer covering at least a portion of the reflective electrode layer and a portion of an upper surface of the second semiconductor layer, wherein the transparent cover layer is thicker than adjacent portions around an edge of the reflective electrode layer, and wherein an edge of the transparent cover layer is spaced apart from the edge of the upper surface of the mesa structure and positioned on the upper surface of the mesa structure.

14. The semiconductor light-emitting device as claimed in claim 13, wherein a distance between the edge of the upper surface of the mesa structure and an edge of the transparent cover layer is less than a distance between the edge of the upper surface of the mesa structure and the edge of the reflective electrode layer.

15. The semiconductor light-emitting device as claimed in claim 13, further comprising:
an insulating structure covering the lower surface portion of the first semiconductor layer and the upper surface of the second semiconductor layer;
a first interconnection conductive layer in contact with the lower surface portion of the first semiconductor layer through the insulating structure; and
a second interconnection conductive layer electrically connected to the reflective electrode layer through the insulating structure.

16. The semiconductor light-emitting device as claimed in claim 15, wherein:
the transparent cover layer includes an insulating material, and
the second interconnection conductive layer contacts the reflective electrode layer through the transparent cover layer.

17. The semiconductor light-emitting device as claimed in claim 15, wherein:
the transparent cover layer includes a conductive oxide, and
the second interconnection conductive layer contacts the transparent cover layer.

18. The semiconductor light-emitting device as claimed in claim 15, wherein:

the transparent cover layer includes a lower transparent cover layer including a conductive oxide, and an upper transparent cover layer covering the lower transparent cover layer and including an insulating material, and the second interconnection conductive layer contacts the lower transparent cover layer through the upper transparent cover layer.

19. A semiconductor light-emitting device, comprising a light-emitting structure including a first semiconductor layer, an active layer, and a second semiconductor layer and having a mesa structure defined by a plurality of trenches exposing a lower surface portion of the first semiconductor layer;

a reflective electrode layer covering an upper surface of the mesa structure and spaced apart from an edge of the upper surface of the mesa structure;

a transparent cover layer covering at least a portion of the reflective electrode layer and a portion of an upper surface of the second semiconductor layer and spaced apart from the edge of the upper surface of the mesa structure;

an insulating structure covering an upper surface of the first semiconductor layer and the upper surface of the second semiconductor layer around the transparent cover layer;

a first interconnection conductive layer electrically connected to the first semiconductor layer through the insulating structure; and a second interconnection conductive layer electrically connected to the reflective electrode layer through the insulating structure, wherein the transparent cover layer includes a first portion and a second portion covering the portion of the upper surface of the second semiconductor layer, the first portion including an upper surface that upwardly protrudes at a higher level than adjacent upper surfaces around an edge of the reflective electrode layer, the second portion having a concave upper surface.

20. The semiconductor light-emitting device as claimed in claim 19, wherein a distance between the edge of the upper surface of the mesa structure and the edge of the reflective electrode layer is greater than a distance between the edge of the upper surface of the mesa structure and an edge of the transparent cover layer and has a value greater than 0 μm and less than 2 μm.

* * * * *